(12) United States Patent
Saito et al.

(10) Patent No.: US 12,133,358 B2
(45) Date of Patent: Oct. 29, 2024

(54) HEAT EXCHANGER

(71) Applicant: DENSO CORPORATION, Kariya (JP)

(72) Inventors: Yuya Saito, Kariya (JP); Yuuki Suzuki, Kariya (JP); Yuusuke Toda, Kariya (JP); Takeshi Okinotani, Kariya (JP)

(73) Assignee: DENSO CORPORATION, Kariya (JP)

( * ) Notice: Subject to any disclaimer, the term of this patent is extended or adjusted under 35 U.S.C. 154(b) by 188 days.

(21) Appl. No.: 17/979,947

(22) Filed: Nov. 3, 2022

(65) Prior Publication Data

US 2023/0050599 A1 Feb. 16, 2023

Related U.S. Application Data

(63) Continuation of application No. PCT/JP2021/020879, filed on Jun. 1, 2021.

(30) Foreign Application Priority Data

Jun. 17, 2020 (JP) .................................. 2020-104893
Aug. 31, 2020 (JP) .................................. 2020-146344

(51) Int. Cl.
 *G06F 1/16* (2006.01)
 *F28F 13/08* (2006.01)
 (Continued)

(52) U.S. Cl.
 CPC ......... *H05K 7/20263* (2013.01); *F28F 13/08* (2013.01); *H05K 7/2039* (2013.01)

(58) Field of Classification Search
 CPC ............. H05K 7/20263; H05K 7/2039; H05K 7/20409; H05K 7/20436; H05K 7/205; H05K 7/20218; F28F 13/06; F28F 13/08
 See application file for complete search history.

(56) References Cited

U.S. PATENT DOCUMENTS 3,845,814 A * 11/1974 Kun ....................... B21D 53/04
                                                            29/890.039
4,211,277 A * 7/1980 Grosz-Roll, Friedrich ................
                                                         B01F 25/43161
                                                            366/337

(Continued)

FOREIGN PATENT DOCUMENTS

JP 2003047258 A 2/2003
JP 2009277768 A 11/2009

(Continued)

*Primary Examiner* — Anthony M Haughton
(74) *Attorney, Agent, or Firm* — Harness, Dickey & Pierce, P.L.C.

(57) ABSTRACT

A heat exchanger includes a plurality of fins that are spaced from each other and are arranged to divide a heat medium flow passage into a plurality of narrow passages. Each fin incudes a plurality of thick wall portions and a plurality of thin wall portions which are alternately arranged in a passage longitudinal direction. Each adjacent two of the plurality of fins, which are adjacent to each other, are defined as one fine and another fin, and each of the plurality of thick wall portions of the one fin is opposed to an adjacent one of the plurality of thin wall portions of the another fin in a fin arrangement direction, and each of the plurality of thin wall portions of the one fin is opposed to an adjacent one of the plurality of thick wall portions of the another fin in the fin arrangement direction.

10 Claims, 22 Drawing Sheets

(51) Int. Cl.
  *H05K 5/00*  (2006.01)
  *H05K 7/00*  (2006.01)
  *H05K 7/20*  (2006.01)

(56) References Cited

U.S. PATENT DOCUMENTS

| | | | | |
|---|---|---|---|---|
| 5,655,600 | A * | 8/1997 | Dewar | F28D 9/0062 165/DIG. 356 |
| 6,988,534 | B2 * | 1/2006 | Kenny | G06Q 20/20 174/15.1 |
| 11,204,205 | B2 * | 12/2021 | Coddé | H01L 23/473 |
| 2006/0002087 | A1 * | 1/2006 | Bezama | H01L 23/473 257/E23.098 |
| 2009/0145581 | A1 * | 6/2009 | Hoffman | F28F 3/14 165/80.3 |
| 2011/0284197 | A1 | 11/2011 | Sugimoto | |
| 2011/0315367 | A1 * | 12/2011 | Romero | F28F 3/022 165/185 |
| 2013/0220587 | A1 * | 8/2013 | Tamura | F28F 3/022 165/185 |
| 2014/0091453 | A1 * | 4/2014 | Mori | F28F 13/06 165/104.33 |
| 2015/0136370 | A1 * | 5/2015 | Furumura | F28F 21/02 165/165 |
| 2016/0377349 | A1 * | 12/2016 | Cool | F24H 9/0021 165/109.1 |
| 2021/0014986 | A1 * | 1/2021 | Xia | C22C 26/00 |

FOREIGN PATENT DOCUMENTS

| | | |
|---|---|---|
| JP | 2011228508 A | 11/2011 |
| JP | 5545260 B2 | 7/2014 |
| JP | 6262422 B2 | 1/2018 |
| WO | WO-2019176620 A1 | 9/2019 |

* cited by examiner

FIG. 21
(A)
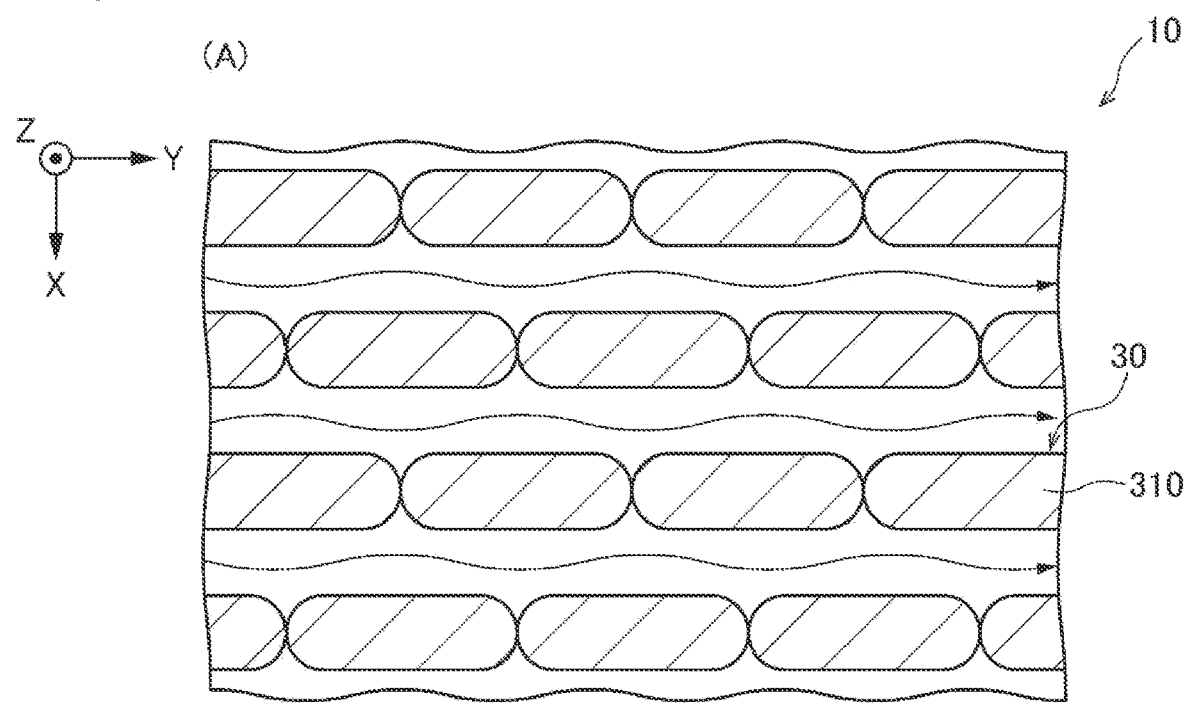
(B)
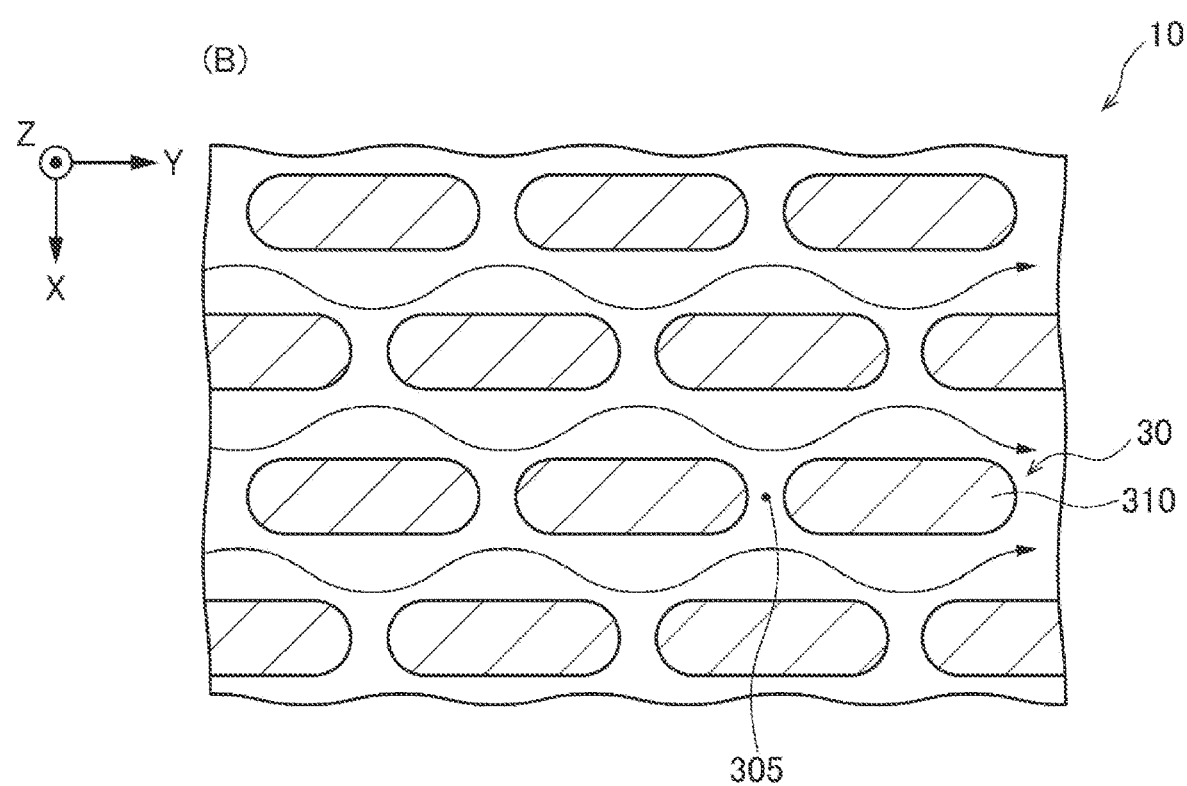

FIG. 22
(A)
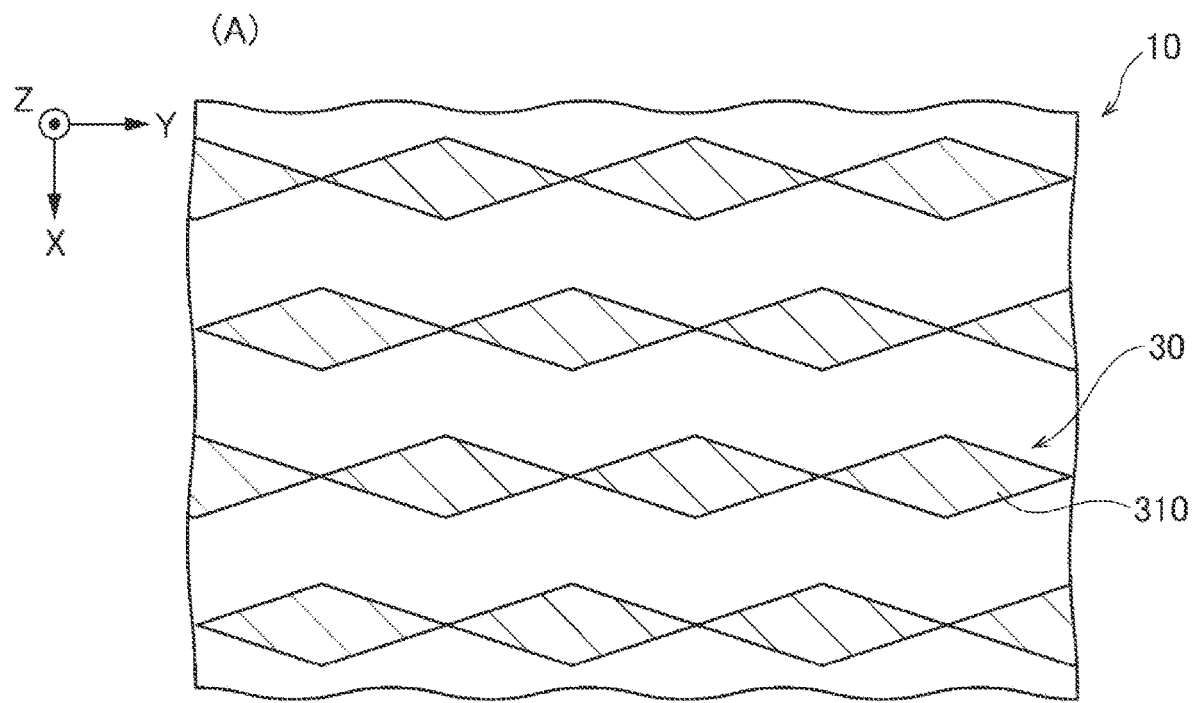
(B)
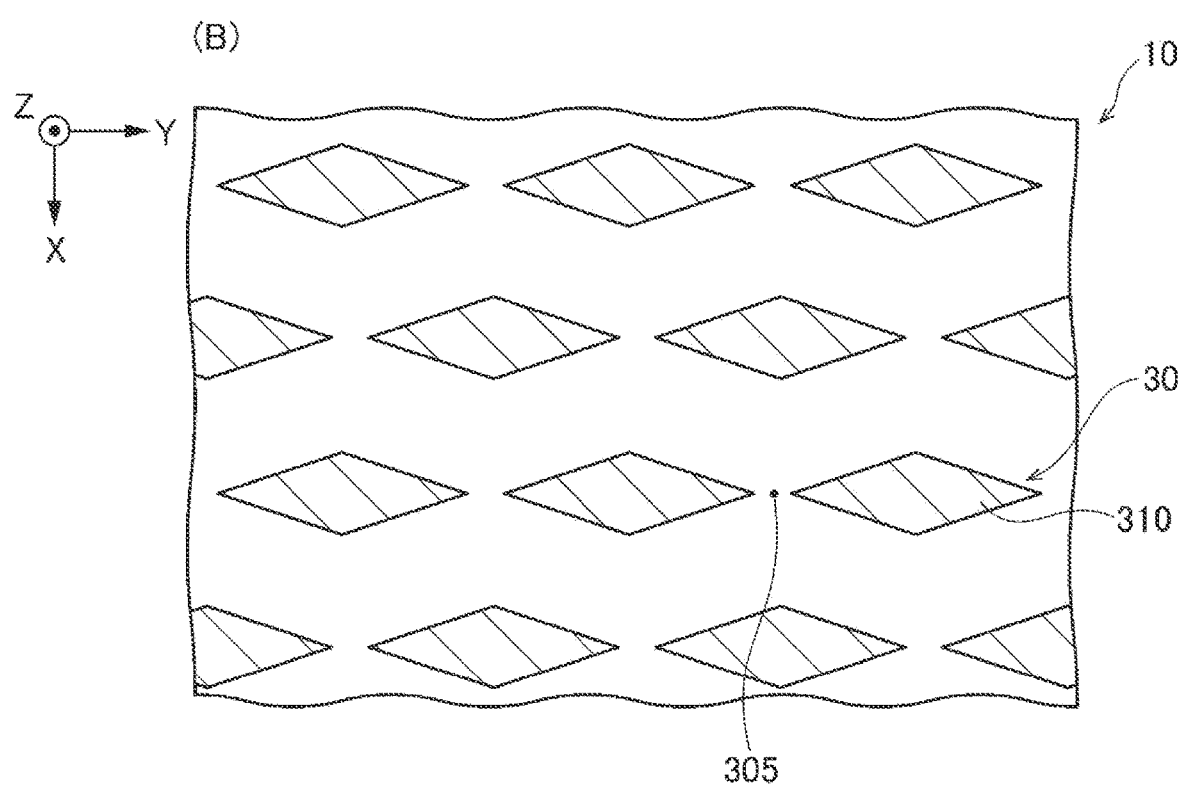

HEAT EXCHANGER

CROSS REFERENCE TO RELATED APPLICATIONS

This application is a continuation application of International Patent Application No. PCT/JP2021/020879 filed on Jun. 1, 2021, which designated the U.S. and claims the benefit of priority from Japanese Patent Application No. 2020-104893 filed on Jun. 17, 2020 and Japanese Patent Application No. 2020-146344 filed on Aug. 31, 2020. The entire disclosures of all of the above applications are incorporated herein by reference.

TECHNICAL FIELD

The present disclosure relates to a heat exchanger.

BACKGROUND

Previously, there has been proposed a heat exchanger for releasing heat of an electronic component, such as a semiconductor device. The previously proposed heat exchanger includes a plurality of passage pipes each of which has a heat medium flow passage that conducts a heat medium. A plurality of inner fins, which divide the heat medium flow passage into a plurality of narrow passages, are arranged at an inside of the passage pipe. Each of the inner fins is formed as a wave fin, a plate portion of which is corrugated in a longitudinal direction when viewed in an arrangement direction of the inner fins.

SUMMARY

This section provides a general summary of the disclosure, and is not a comprehensive disclosure of its full scope or all of its features.

According to the present disclosure, there is provided a heat exchanger configured to exchange heat between a heat medium, which is conducted in a heat medium flow passage, and an electronic component. The heat exchanger includes a plurality of fins that are placed in the heat medium flow passage. The plurality of fins are spaced from each other and are arranged in a predetermined direction, which is defined as a fin arrangement direction, to divide the heat medium flow passage into a plurality of narrow passages. The heat medium flow passage extends in a passage longitudinal direction which is a direction that intersects the fin arrangement direction. Each of the plurality of fins includes a plurality of thick wall portions and a plurality of thin wall portions which are alternately arranged along a whole or a portion of the fin in the passage longitudinal direction. A plate wall thickness of each of the plurality of thick wall portions is relatively large, and a plate wall thickness of each of the plurality of thin wall portions is relatively small.

BRIEF DESCRIPTION OF DRAWINGS

The drawings described herein are for illustrative purposes only of selected embodiments and not all possible implementations, and are not intended to limit the scope of the present disclosure.

FIG. 21 is a cross-sectional view showing a structure of a fin according to a modification of the fifth embodiment at (A) and (B).

FIG. 22 is a cross-sectional view showing a structure of a fin according to another modification of the fifth embodiment at (A) and (B).

DETAILED DESCRIPTION

Figure 1:
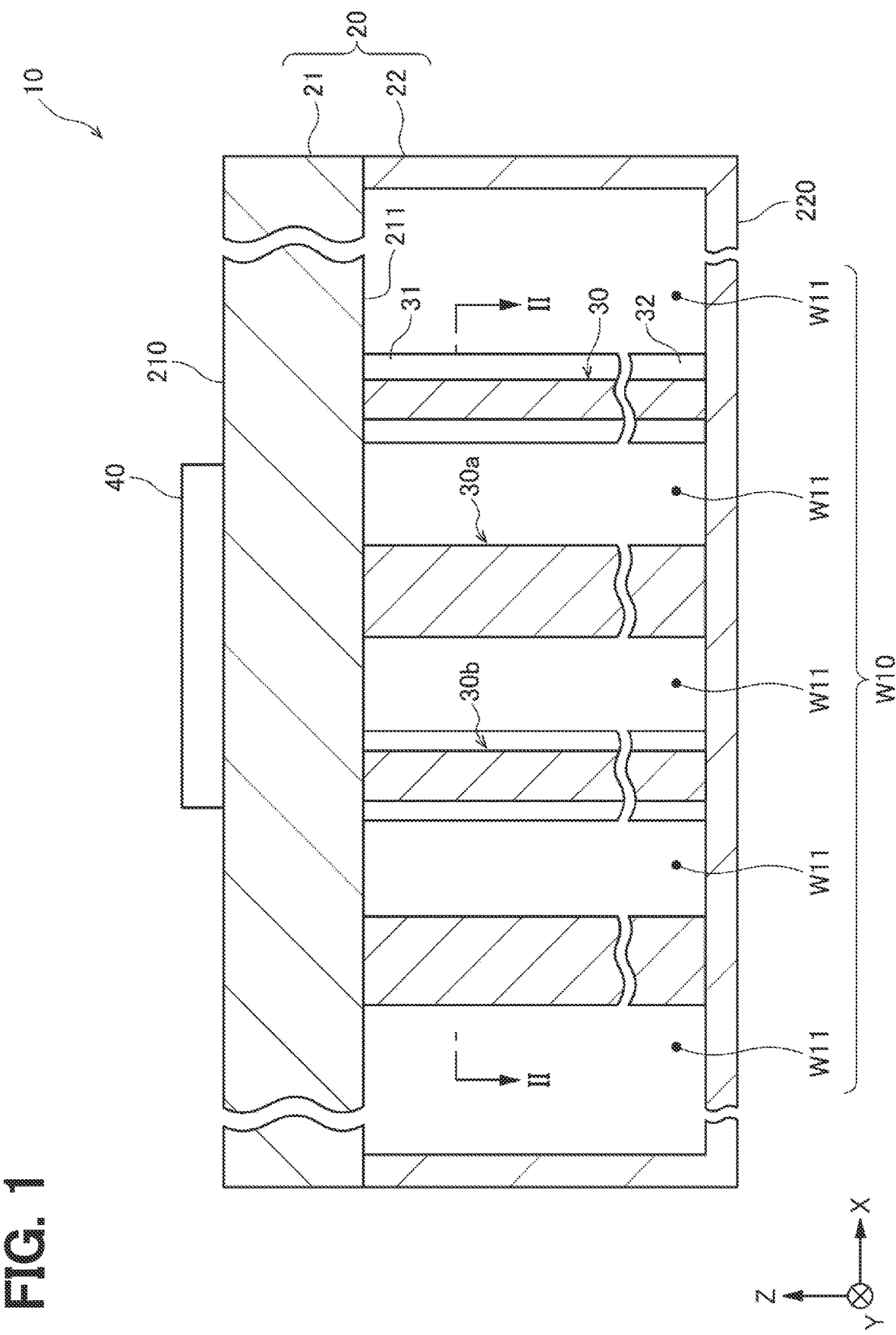
FIG. 1 is a cross-sectional view showing a structure of a heat exchanger according to a first embodiment.

Previously, there has been proposed a heat exchanger for releasing heat of an electronic component, such as a semiconductor device. The previously proposed heat exchanger includes a plurality of passage pipes each of which has a heat medium flow passage that conducts heat medium. A plurality of inner fins, which divide the heat medium flow passage into a plurality of narrow passages, are arranged at an inside of the passage pipe. Each of the inner fins is formed as a wave fin, a plate portion of which is corrugated in a longitudinal direction when viewed in an arrangement direction of the inner fins. By using the wave fins, each narrow passage, which is located between corresponding adjacent two of the wave fins, is formed in a meandering form. As a result, the flow of the heat medium, which is conducted in the narrow passage, tends to become turbulent, so that the heat exchange performance of the heat exchanger can be increased.

In the heat exchanger, one of the methods for increasing the heat exchange performance is to increase a plate wall thickness of the inner fin. By increasing the plate wall thickness of the inner fin, the fin efficiency can be increased. Therefore, the heat exchange performance of the heat exchanger can be increased. The fin efficiency indicates the heat transfer amount in a case where the fin surface is assumed to be equal to a root temperature of all the fins, that is, a ratio of the actual heat transfer amount of the fin to the ideal heat transfer amount of the fin.

In the previously proposed heat exchanger, when the plate wall thickness is increased to increase the fin efficiency of the wave fin, a gap between adjacent wave fins becomes small. That is, a width of each narrow passage is reduced. As a result, when the flow velocity of the heat medium, which is conducted in each narrow passage, is increased, there is a risk of causing a pressure loss in the heat medium flow passage. As described above, since there is a trade-off between the fin efficiency and the pressure loss in the heat medium flow passage, it is difficult to have them in a good balance.

According to one aspect of the present disclosure, there is provided a heat exchanger configured to exchange heat between a heat medium, which is conducted in a heat medium flow passage, and an electronic component. The heat exchanger includes a plurality of fins that are placed in the heat medium flow passage. The plurality of fins are spaced from each other and are arranged in a predetermined direction, which is defined as a fin arrangement direction, to divide the heat medium flow passage into a plurality of narrow passages. The heat medium flow passage extends in a passage longitudinal direction which is a direction that intersects the fin arrangement direction. Each of the plurality of fins includes a plurality of thick wall portions and a plurality of thin wall portions which are alternately arranged along a whole or a portion of the fin in the passage longitudinal direction. A plate wall thickness of each of the plurality of thick wall portions is relatively large, and a plate wall thickness of each of the plurality of thin wall portions is relatively small. Each adjacent two of the plurality of fins, which are adjacent to each other, are respectively defined as one fine and another fin, and each of the plurality of thick wall portions of the one fin is opposed to an adjacent one of the plurality of thin wall portions of the another fin in the fin arrangement direction, and each of the plurality of thin wall portions of the one fin is opposed to an adjacent one of the plurality of thick wall portions of the another fin in the fin arrangement direction.

According to this configuration, when each of the thick wall portions of the one fin and the adjacent one of the thin wall portions of the another fin are arranged to oppose each other, the narrow passage, which is formed between the fins, is formed in a meandering form without narrowing the passage width of the narrow passage. Therefore, an increase in the pressure loss of the heat medium, which flows in the heat medium flow passage, can be limited while realizing the meandering flow of the heat medium. Furthermore, by forming not only the thin wall portions but also the thick wall portions at the fins, the plate wall thickness of the respective fins can be increased as compared with a case where the thin plate fins are used, and thereby the fin efficiency can be improved.

Hereinafter, a heat exchanger of various embodiments will be described with reference to the drawings. In order to facilitate understanding of the description, the same components are indicated by the same reference signs as much as possible in each drawing, and redundant descriptions are omitted.

First Embodiment

First, a heat exchanger 10 of a first embodiment shown in FIG. 1 will be described. A semiconductor device 40, such as an insulated gate bipolar transistor (IGBT), which is a component of, for example, an inverter device, is installed at an outer surface of this heat exchanger 10. In this embodiment, the semiconductor device 40 serves as an electronic component. The heat exchanger 10 is a device that releases heat from the semiconductor device 40 through heat exchange between a heat medium, such as water (or coolant), which flows in the heat exchanger, and the semiconductor device 40. The heat exchanger 10 includes a base body 20 and a plurality of fins 30.

The base body 20 is made of metal, such as aluminum or copper, and is shaped in a hollow box form. The base body 20 includes a first base (serving as a base) 21 and a second base 22.

The first base 21 is shaped in a planar plate form. The semiconductor device 40 is installed to an outer surface 210 that is one of two opposite surfaces of the first base 21.

A shape of a cross-section of the second base 22, which is perpendicular to a direction of an arrow Y in the drawing, is in a form of a recess. The first base 21 is assembled to the second base 22 such that the first base 21 closes an opening of the second base 22, and thereby the base body 20, which is shaped in the hollow box form, is formed. An internal space of the base body 20 forms a heat medium flow passage W10 that is configured to conduct the heat medium. The heat medium flow passage W10 extends in the direction of the arrow Y. Hereafter, the direction of the arrow Y will be also referred to as a passage longitudinal direction.

The fins 30 are made of metal, such as aluminum or copper, and are installed at the inside of the base body 20. The fins 30 and the first base 21 are formed integrally in one-piece. The fins 30 are arranged at a predetermined interval in a direction of an arrow X shown in the drawings, i.e., in the direction that is perpendicular to the passage longitudinal direction Y. The heat medium flow passage W10 at the inside of the base body 20 is divided by the fins 30 into a plurality of narrow passages W11. Each of the narrow passages W11 is configured to conduct the heat medium. One end portion 31 of each of the fins 30 is fixed to an inner surface 211 that is the other one of the opposite surfaces of the first base 21. The other end portion 32 of each of the fins 30 contacts an inner surface of the bottom wall 220 of the second base 22.

Hereinafter, the direction of the arrow X will be referred to as a fin arrangement direction X. Furthermore, a direction, which is perpendicular to both of the fin arrangement direction X and the passage longitudinal direction Y, will be referred to as a fin height direction Z.

Figure 2:
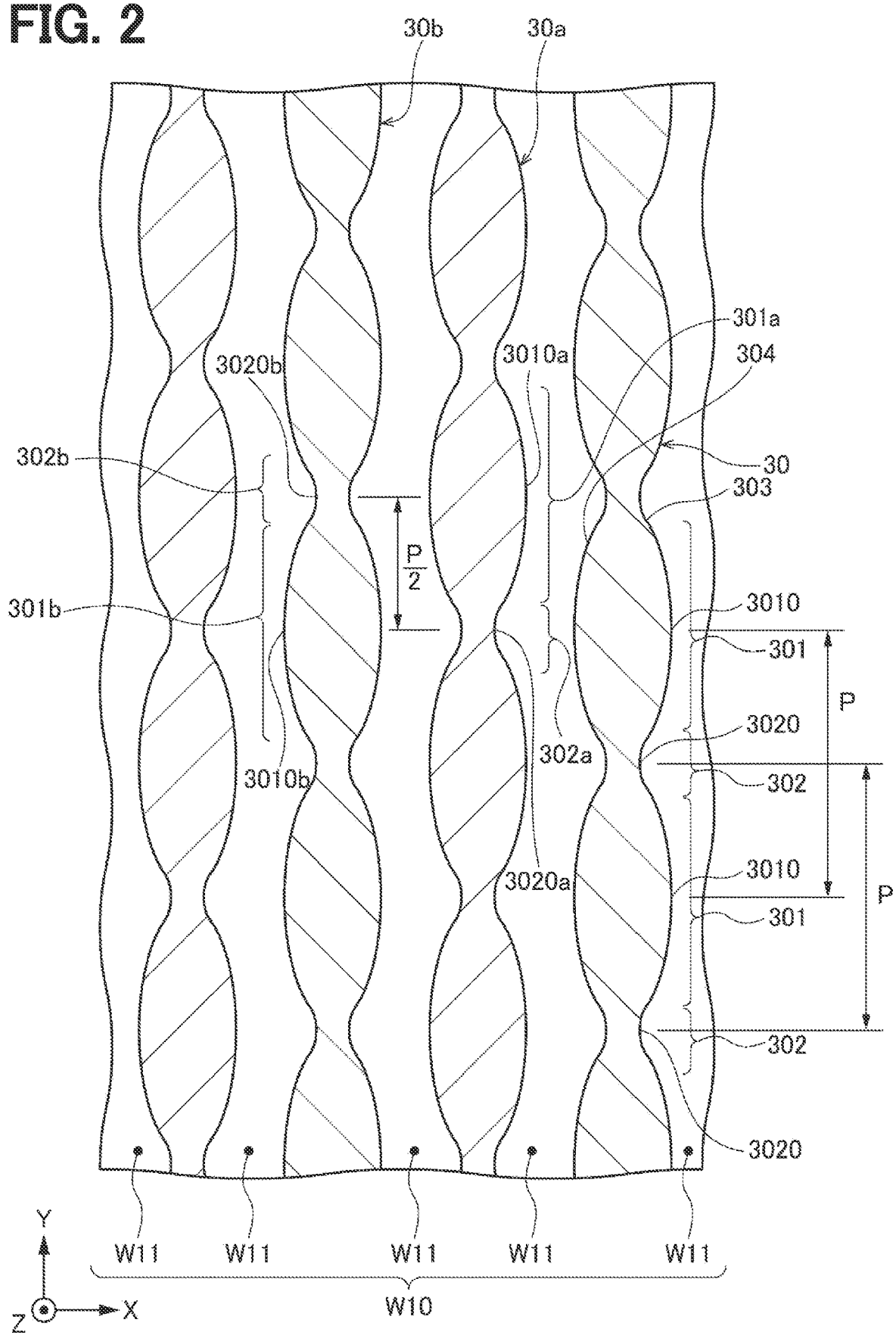
FIG. 2 is a cross-sectional view taken along line II-II in FIG. 1.

FIG. 2 is a cross-sectional view taken along the line II-II in FIG. 1. As shown in FIG. 2, each of the fins 30 has a plurality of thick wall portions 301 and a plurality of thin wall portions 302 which are alternately arranged in the passage longitudinal direction Y. A plate wall thickness of each of the thick wall portions 301 is relatively large, and a plate wall thickness of each of thin wall portions 302 is relatively small. As a whole, the wall thickness of each of the fins 30 is not uniform. Each of the thick wall portions 301 is a portion that has the plate wall thickness which is larger than an average value of the plate wall thicknesses of the fin 30. Each of the thin wall portions 302 is a portion that has the plate wall thickness which is small than the average value of the plate wall thicknesses of the fin 30. A length of each thick wall portion 301 and a length of each thin wall portion 302, which are measured in the passage longitudinal direction Y, are equal to each other. A length of each fin 30 measured in the fin height direction Z is shorter than a length of the fin 30 measured in the passage longitudinal direction Y and is longer than a length of the first base 21 measured in the fin height direction Z. Hereinafter, a thickest part of each thick wall portion 301, which has a largest plate wall thickness, will be referred to as a thickest wall part 3010, a thinnest part of each thin wall portion 302, which has a smallest plate wall thickness, will be referred to as a thinnest wall part 3020.

In each fin 30, the plurality of thickest wall parts 3010 are arranged at a predetermined pitch P in the passage longitudinal direction Y, and the plurality of thinnest wall parts 3020 are arranged at the same pitch P in the passage longitudinal direction Y. Two opposite surfaces 303, 304 of each fin 30, each of which faces the corresponding narrow passage W11, are respectively formed as a curved surface such that each thickest wall part 3010 and the next thinnest wall part 3020 smoothly continue. Therefore, each of the surfaces 303, 304 of the fin 30 is shaped as a substantially cycloid curved surface that continuously extends in the passage longitudinal direction Y. A length of each thickest wall part 3010 measured in the fin arrangement direction X is defined as a width of the thickest wall part 3010. A length of each thinnest wall part 3020 measured in the fin arrangement direction X is defined as a width of the thinnest wall part 3020. Also, a length of each narrow passage W11 measured in the fin arrangement direction X is defined as a passage width. In such a case, the width of each thickest wall part 3010 is larger than a maximum passage width of each narrow passage W11. Furthermore, the width of each thinnest wall part 3020 is smaller than a minimum passage width of each narrow passage W11.

Hereinafter, adjacent two of the fins 30, which are adjacent to each other in the fin arrangement direction X, will be referred to as fines 30a, 30b. Furthermore, the thick wall portions of the fins 30a, 30b will be respectively indicated by reference signs 301a, 301b, and the thin wall portions of the fins 30a, 30b will be respectively indicated by reference signs 302a, 302b. Furthermore, the thickest wall parts of the fins 30a, 30b will be respectively indicated by reference signs 3010a, 3010b, and the thinnest wall parts of the fins 30a, 30b will be respectively indicated by reference signs 3020a, 3020b.

As shown in FIG. 2, each of the thick wall portions 301a of one fin 30a among the fins 30a, 30b is opposed to an adjacent one of thin wall portions 302b of the other fin 30b among the fins 30a, 30b in the fin arrangement direction X. Furthermore, each of the thin wall portions 302a of the one fin 30a is opposed to an adjacent one of thick wall portions 301b of the other fin 30b in the fin arrangement direction X. Furthermore, each of the thickest wall parts 3010a of the one fin 30a is displaced from an adjacent one of the thickest wall parts 3010b of the other fin 30b by a half (i.e., P/2) of the predetermined pitch P in the passage longitudinal direction Y. Similarly, each of the thinnest wall parts 3020a of the one fin 30a is displaced from an adjacent one of the thinnest wall part 3020b of the other fin 30b by the half (i.e., P/2) of the predetermined pitch P in the passage longitudinal direction Y. A shape of a cross-section of the one fin 30a, which is perpendicular to the fin height direction Z, and a shape of a cross-section of the other fin 30b, which is perpendicular to the fin height direction Z, are identical to each other except that the fin 30a and the fin 30b are displaced from each other by the half pitch (i.e., P/2) in the passage longitudinal direction Y.

According to the heat exchanger 10 of the present embodiment described above, the following actions and effects (advantages) indicated at the following sections (1) to (7) can be achieved.

(1) As shown in FIG. 2, when the thick wall portions 301a, 301b and the thin wall portions 302a, 302b of the adjacent fins 30a, 30b are arranged to oppose each other, the narrow passage W11, which is formed between the fins 30a, 30b, is formed in a meandering form without narrowing the passage width of the narrow passage W11. Therefore, an increase in the pressure loss of the heat medium, which flows in the heat medium flow passage W10, can be limited while realizing the meandering flow of the heat medium. Further, by forming not only the thin wall portions 302a, 302b but also the thick wall portions 301a, 301b at the fins 30a, 30b, the plate wall thickness of the respective fins 30a, 30b can be ensured as compared with a case where the thin plate fins are used, and thereby the fin efficiency can be improved.

Figure 3:
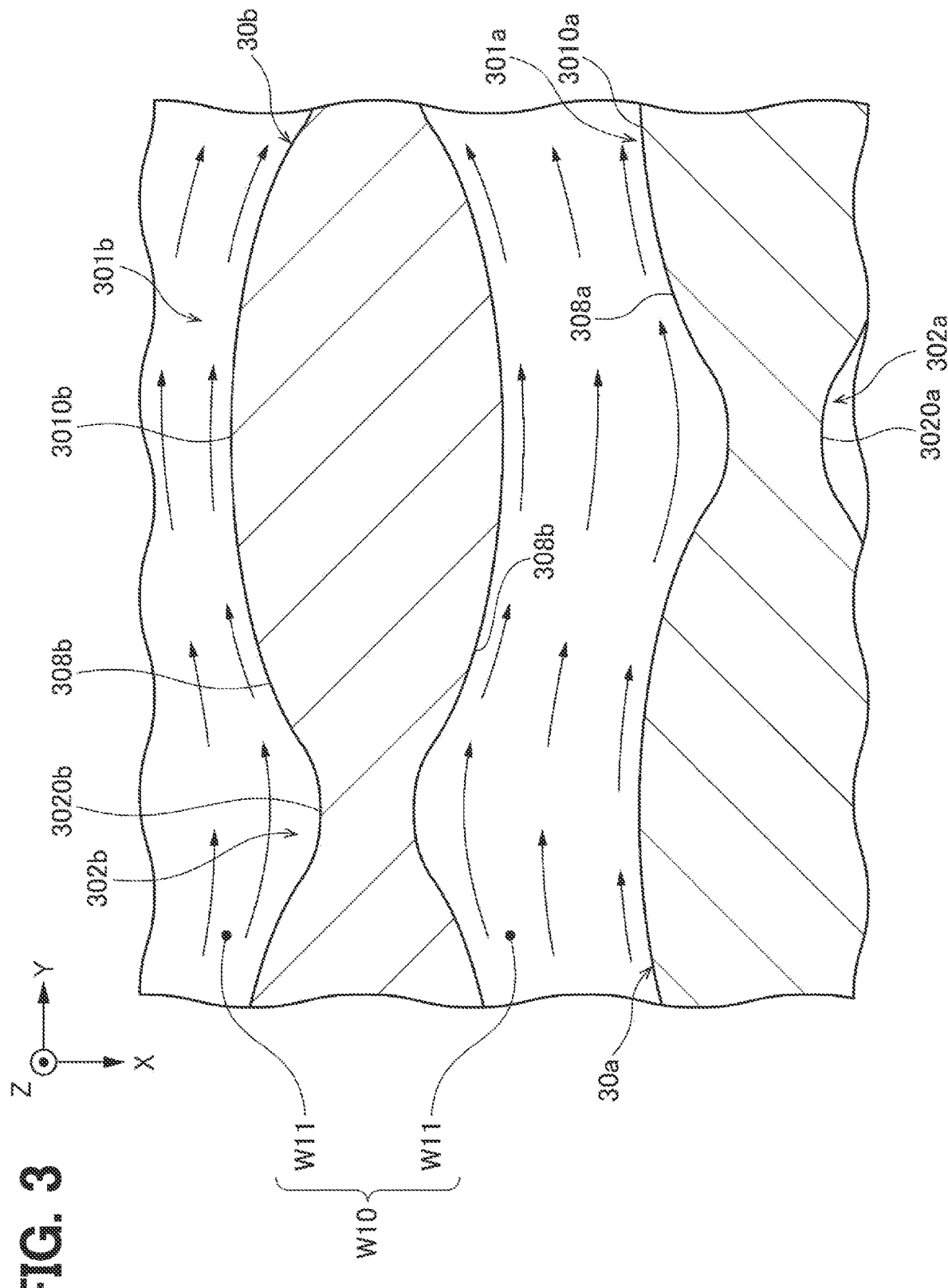
FIG. 3 is a diagram schematically showing a flow of a heat medium in the heat exchanger according to the first embodiment.

(2) In the heat exchanger 10 of the present embodiment, as indicated by the arrows in FIG. 3, the heat medium flows in the meandering form at the inside of the narrow passage W11. As the heat medium flows in this manner, in the fin 30a, a side wall part 308a of the respective thick wall portions 301a becomes a part of the fin 30a, to which the heat medium is likely to collide. Furthermore, in the fin 30b, a side wall part 308b of the respective thick wall portions 301b becomes a part of the fin 30b, to which the heat medium is likely to collide. When the heat medium collides with the respective thick wall portions 301a, 301b of each fin 30a, 30b in this way, the heat of the heat medium can be easily transferred to the fins 30a, 30b, and thereby the fin efficiency can be improved.

(3) A location, at which the heat medium easily separates from the surface of each fin 30a, 30b, is a location that is in vicinity of the thin wall portion 302a, 302b shown in FIG. 3. Therefore, since each thin wall portion 302a, 302b is placed at the corresponding location where the heat exchange between the fin 30a, 30b and the heat medium is less likely to take place, a deterioration in the fin efficiency caused by the provision of the thin wall portion 302a, 302b is less likely to occur.

(4) Each of the thickest wall parts 3010a of the one fin 30a is displaced from the adjacent one of the thickest wall parts 3010b of the other fin 30b by the half P/2 of the predetermined pitch P in the passage longitudinal direction Y. Similarly, each of the thinnest wall parts 3020a of the one fin 30a is displaced from an adjacent one of the thinnest wall part 3020b of the other fin 30b by the half (i.e., P/2) of the predetermined pitch P in the passage longitudinal direction Y. With this configuration, since the narrow passage W11, which is located between the adjacent fins 30a, 30b, can be easily formed in the meandering form, the meandering flow of the heat medium can be more easily realized. As a result, the heat exchange performance of the heat exchanger 10 can be improved.

(5) In the case where the heat medium flows in the meandering form, the heat medium may possibly flow so as to separate from the surface of the fin. When the flow of the heat medium is separated from the surface of the fin, the heat medium tends to be stagnated in this part where the heat medium is separated from the surface of the fin. This may result in a deterioration in the heat exchange performance of the heat exchanger 10. In this regard, the surfaces 303, 304 of each fin 30, which respectively face the corresponding narrow passage W11, is formed as the curved surface. According to this configuration, since the heat medium, which flows in the narrow passage W11, is less likely to be separated from the surface 303, 304, it is possible to limit the deterioration in the heat exchange performance of the heat exchanger 10.

(6) The heat exchanger 10 includes the first base 21 that has the outer surface 210 on which the semiconductor device 40 is installed. The one end portion 31 of each of the fins 30 is fixed to the inner surface 211 of the first base 21. According to this configuration, the heat exchange between the semiconductor device 40 and the heat medium can be effectively performed through the first base 21.

(7) The one end portion 31 of each of the fins 30 is fixed to the inner surface 211 that is the other surface of the first base 21. The other end portion 32 of each of the fins 30 contacts an inner surface of the bottom wall 220 of the second base 22. According to this configuration, each of the narrow passages W11 is formed as an independent flow passage, and thereby a flow of the heat medium, which flows along each corresponding fin 30, is easily formed. As a result, the heat exchange performance of the heat exchanger 10 can be improved.

(Modification)

Next, a modification of the heat exchanger 10 of the first embodiment will be described.

Figure 4:
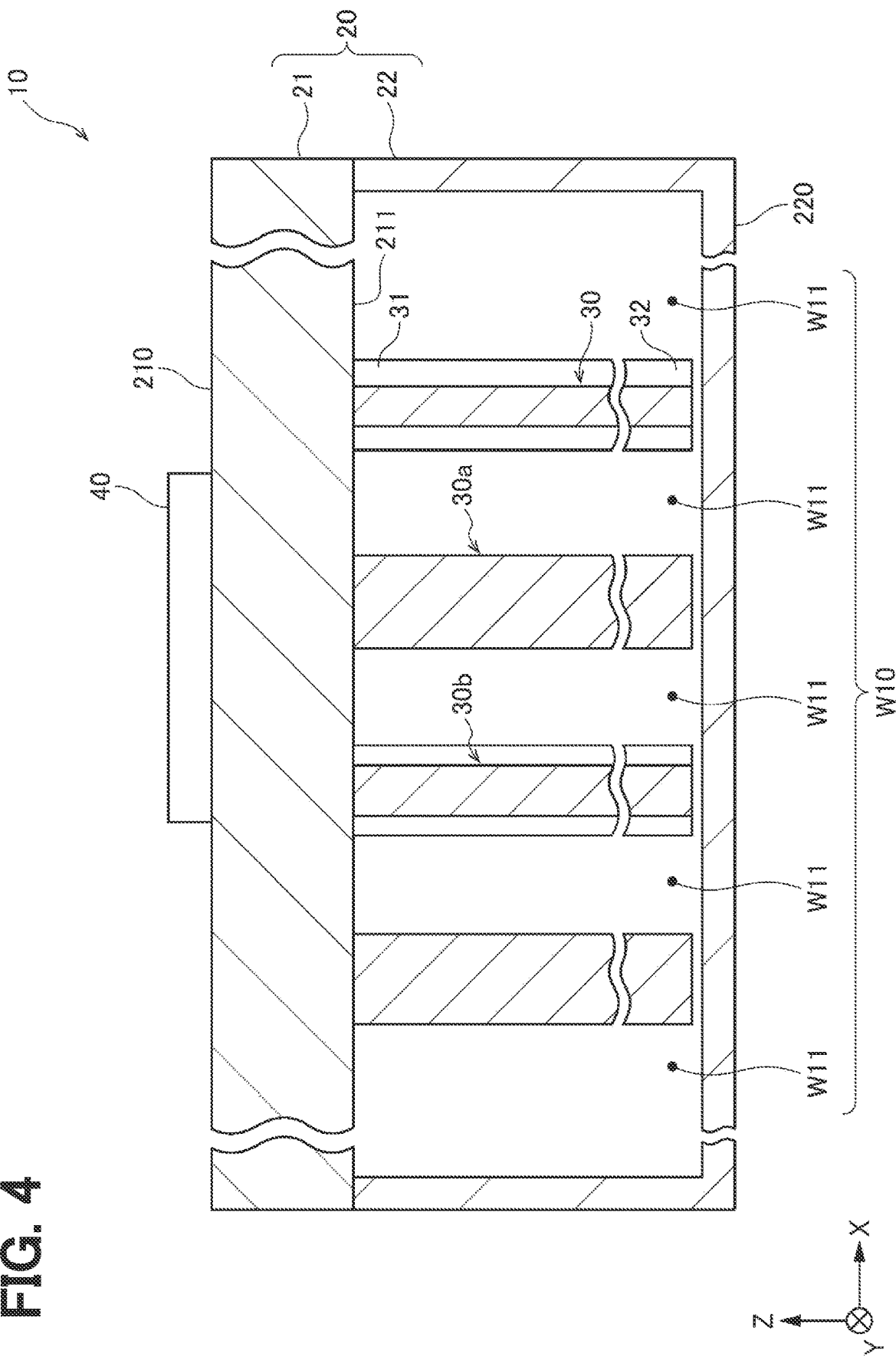
FIG. 4 is a cross-sectional view showing a structure of a heat exchanger according to a modification of the first embodiment.

As shown in FIG. 4, in the heat exchanger 10 of this modification, a gap is formed between the other end portion 32 of each of the fins 30 and the inner surface of the bottom wall 220 of the second base 22. According to the configuration of this modification, even when a dimensional error exists in the length of the fin 30 in the fin height direction Z, the dimensional error can be absorbed in the gap formed between the other end portion 32 of the fin 30 and the bottom wall 220 of the second base 22. Therefore, the dimensional accuracy of the fin 30 can be relaxed.

As shown in FIG. 4, the narrow passages W11 may communicate with each other through the gaps formed between the fins 30 and the bottom wall 220 of the second base 22. In other words, the narrow passages W11 are not necessarily the independent flow passages and may be formed as the flow passages which communicate with each other at the predetermined locations. Alternatively, as shown in FIG. 1, the narrow passages W11 may be formed as the independent flow passages which are independent from each other.

Second Embodiment

Next, the heat exchanger 10 of a second embodiment will be described. The following description focuses on the differences relative to the heat exchanger 10 of the first embodiment.

Figure 5:
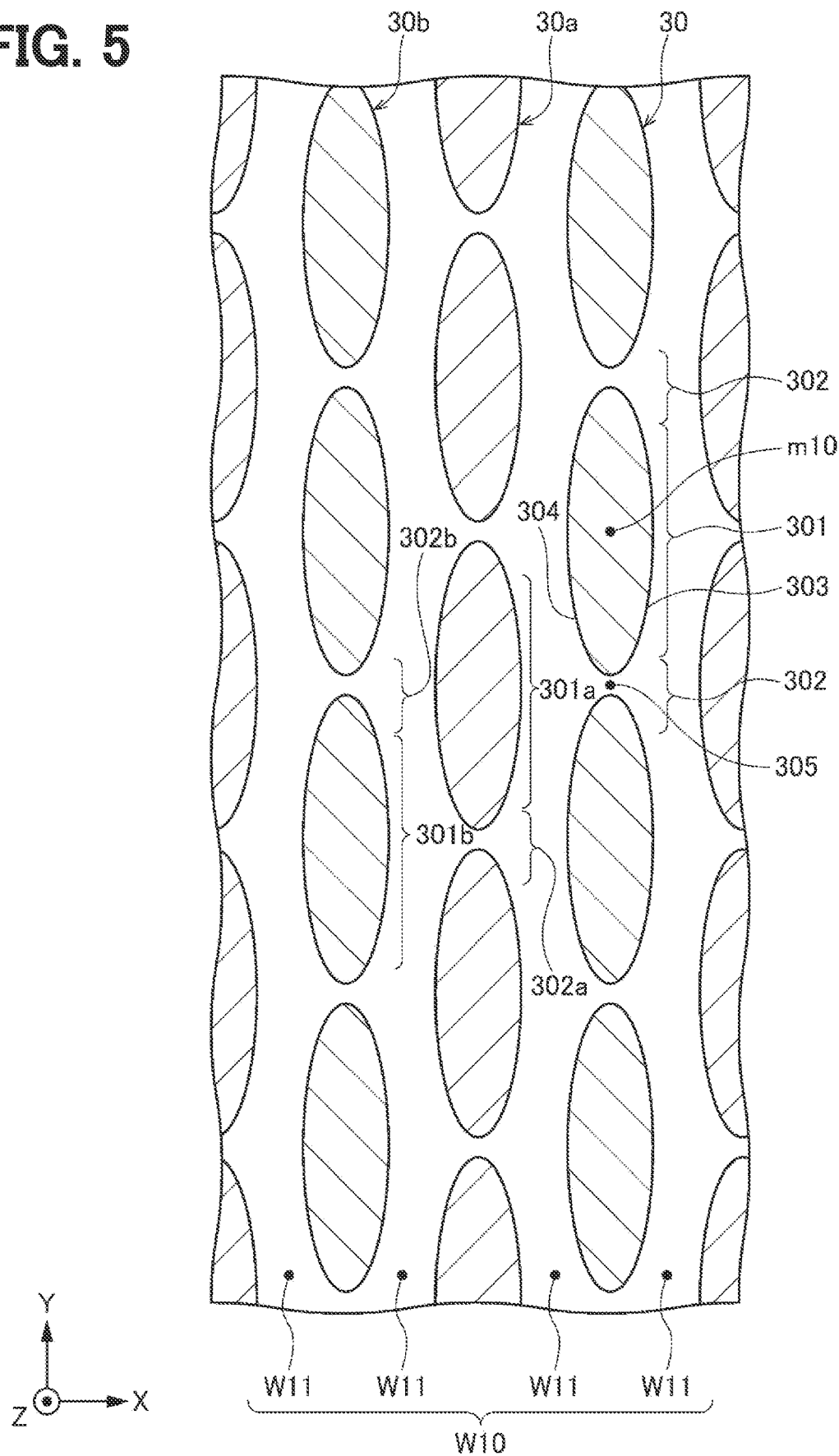
FIG. 5 is a cross-sectional view showing a structure of a fin according to a second embodiment.

As shown in FIG. 5, a plurality of communication passages 305 are formed in each of the fins 30 of the present embodiment such that each of the communication passages 305 extends through the corresponding one of the thin wall portions 302 of the fin 30 in the thickness direction. In the fin 30, each communication passage 305 communicates between the narrow passage W11, which is located along the one surface 303 of the fin 30, and the narrow passage W11, which is located along the other surface 304 of the fin 30.

An interposed portion of the fin 30, which is located between corresponding adjacent two of the thinnest wall parts 3020, has a shape that is line-symmetric with respect to an axis m10 that extends through a center of the interposed portion and is parallel with the fin height direction Z.

Figure 6:
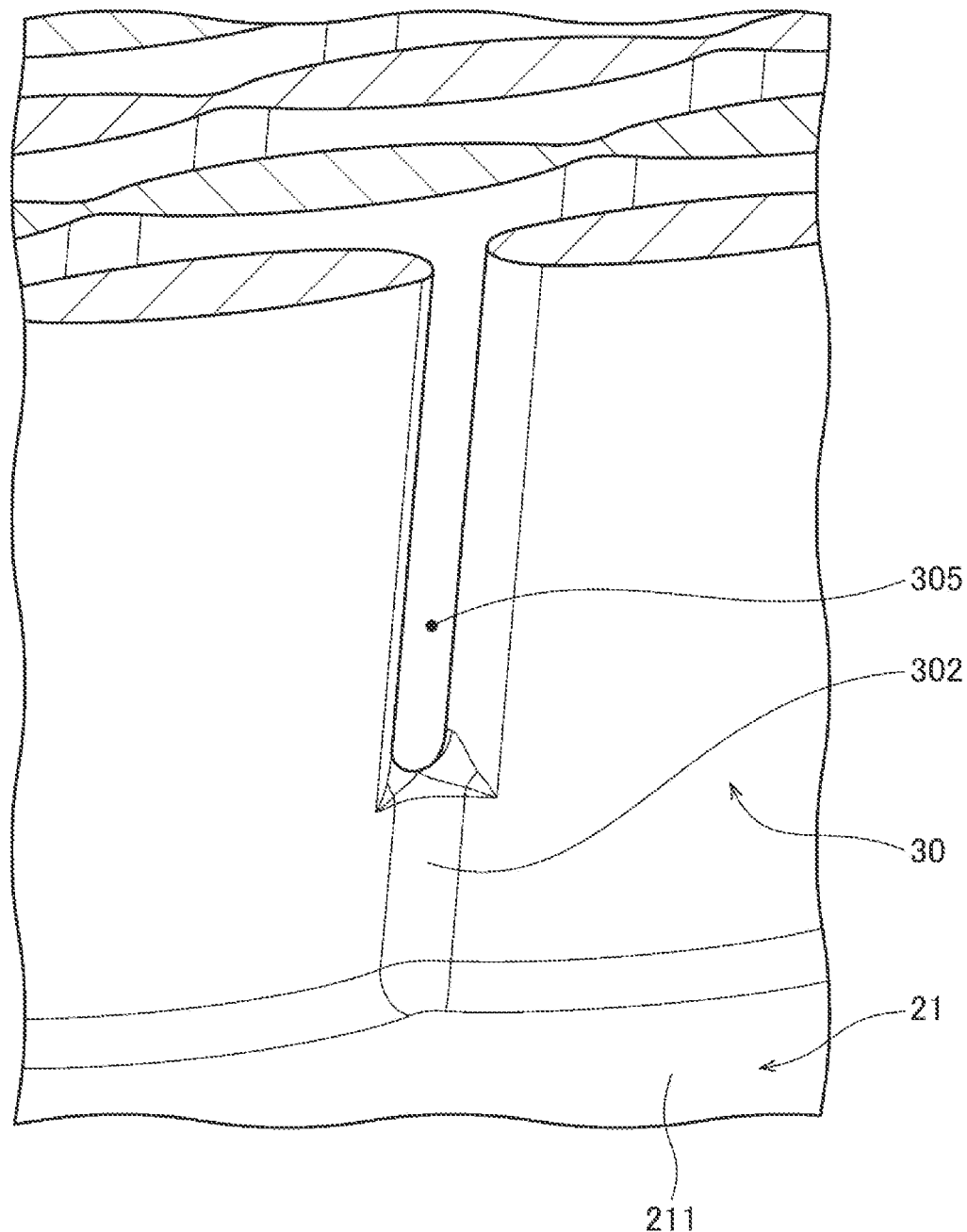
FIG. 6 is a perspective cross-sectional view showing a structure of a heat exchanger according to the second embodiment.

Furthermore, as shown in FIG. 6, the communication passages 305 may be formed only in one or more of the plurality of fins 30. Furthermore, as shown in FIG. 6, each communication passage 305 may be formed in a part of a region, which is from one end to the other end of the corresponding thin wall portion 302 in the fin height direction Z. Alternately, in each fin 30, each communication passage 305 may be formed in the entire region, which is from the one end to the other end of the corresponding thin wall portion 302 in the fin height direction Z.

According to the heat exchanger 10 of the present embodiment described above, the following actions and effects indicated at the following sections (8) and (9) can be achieved.

(8) Since the heat medium can flow between the narrow passages W11 through the communication passages 305, uneven distribution of the heat of the heat medium flowing through the narrow passages W11 can be reduced. As a result, uneven distribution of the heat exchange performance of the heat exchanger 10 can be improved. Furthermore, by forming the communication passages 305 at the fins 30, the fins 30 can be easily molded by a mold. Therefore, the fins 30 can be easily manufactured.

(9) In each fin 30, each communication passage 305 is formed in the part of the region that is from the one end to the other end of the corresponding thin wall portion 302 in the fin height direction Z. According to this configuration, it is possible to obtain an advantage, which is achieved by forming the communication passages 305 at the fins 30, that is, an advantage of improving the uneven distribution of the heat exchange performance. Furthermore, in each of the fins 30, a required heat transfer surface area of the fin 30 can be ensured by the corresponding each of the thin wall portions 302 at which the communication passage 305 is not formed. As a result, the advantage of improving the uneven distribution of the heat exchange performance and the advantage of ensuring the required heat transfer surface area of the fin 30 can be both achieved.

(First Modification)

Next, a first modification of the heat exchanger 10 of the second embodiment will be described.

Figure 7:
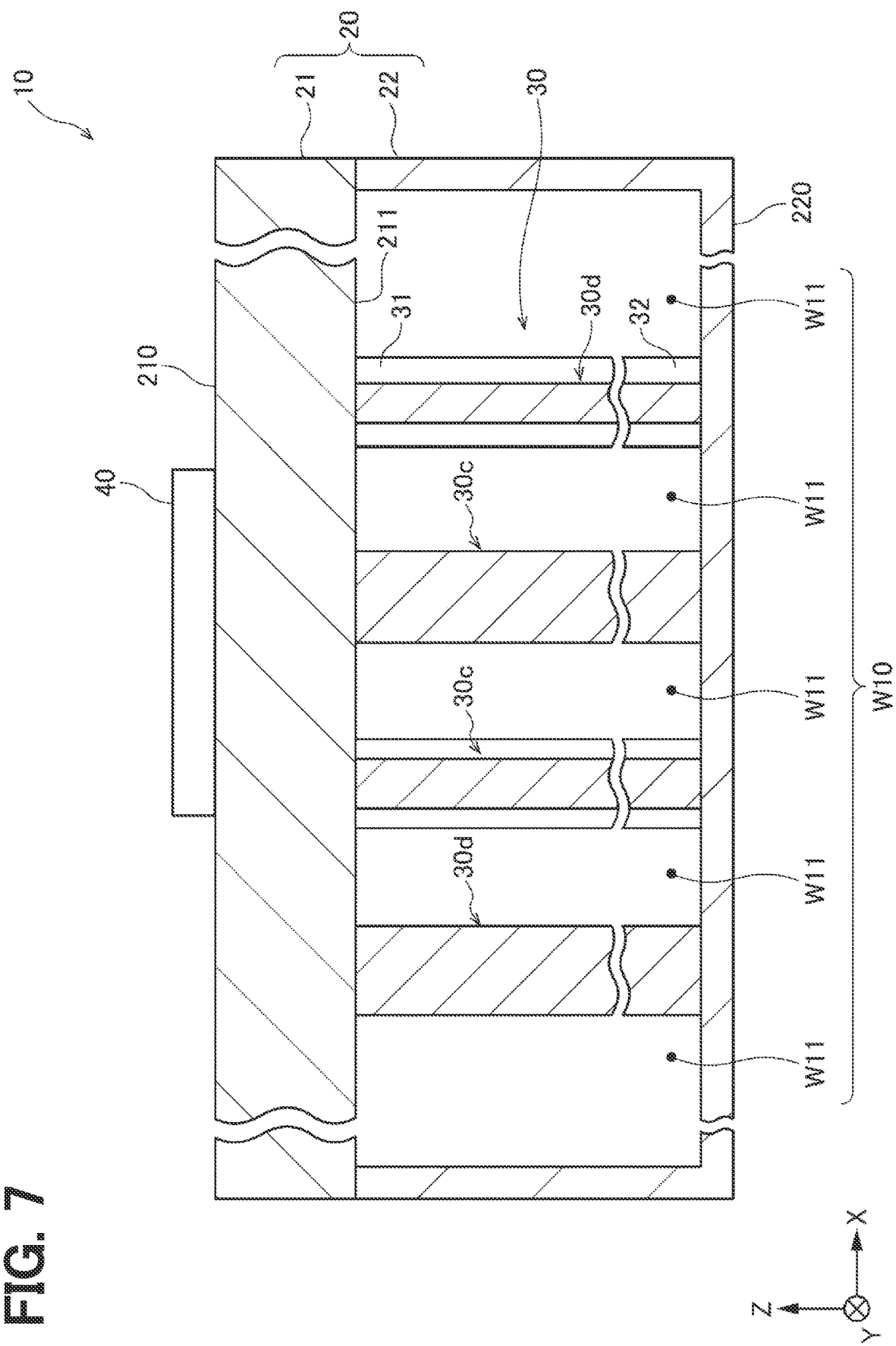
FIG. 7 is a cross-sectional view showing a structure of a heat exchanger according to a first modification of the second embodiment.

As shown in FIG. 7, the fins 30 of this modification include: a plurality of fins 30c, each of which is placed at a position where the fin 30c is opposed to the semiconductor device 40 in the fin height direction Z; and a plurality of fins 30d, each of which is placed at a position where the fin 30d is not opposed to the semiconductor device 40 in the fin height direction Z. In the heat exchanger 10 of this modification, the communication passages 305 are formed at each of the fins 30d, and the communication passages 305 are not formed at each of the fins 30c.

In the heat exchanger 10 shown in FIG. 7, the fin efficiency of the fins 30c, which are opposed to the semiconductor device 40, is more likely to have an influence on the heat releasing performance of the semiconductor device 40 than the fin efficiency of the fins 30d, which are not opposed to the semiconductor device 40. Therefore, if the communication passages 305 are formed at the fins 30c, the fin efficiency of the fins 30c is deteriorated, and thereby, the heat releasing performance of the semiconductor device 40 may be deteriorated. With respect to this point, in the heat exchanger 10 of this modification, since the communication passages 305 are not formed at the fins 30c, there is no concern of deterioration of the fin efficiency in the fins 30c. Therefore, the heat releasing performance of the semiconductor device 40 can be ensured more reliably.

(Second Modification)

Next, a second modification of the heat exchanger 10 of the second embodiment will be described.

Figure 8:
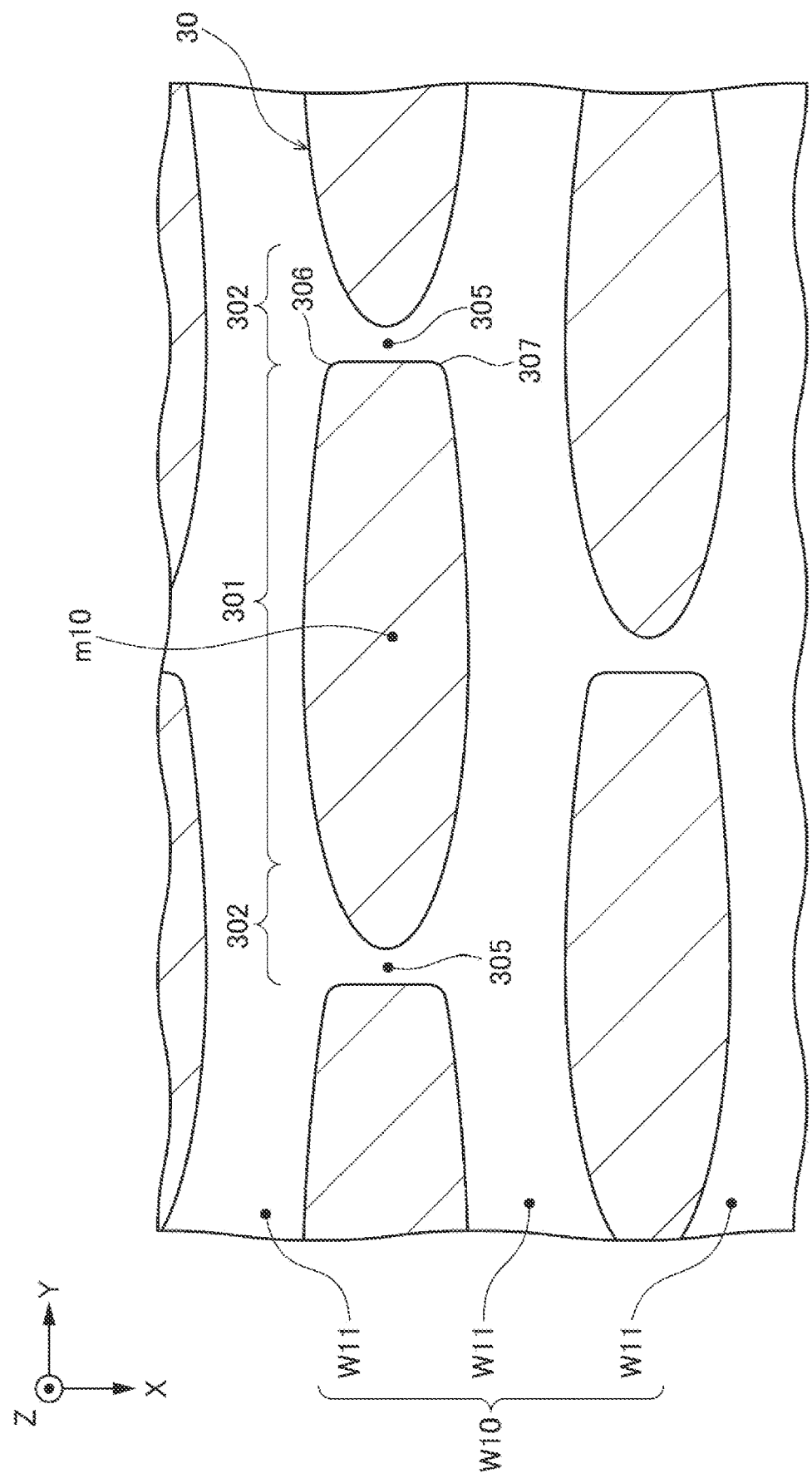
FIG. 8 is a cross-sectional view showing a structure of a fin according to a second modification of the second embodiment.

As shown in FIG. 8, in each of the fins 30 of this modification, each interposed portion, which is located between corresponding adjacent two of the communication passages 305, has a downstream end part located on the downstream side in the passage longitudinal direction Y, and this downstream end part has: a corner 306, which in a form of a sharp corner (unrounded corner) and is located at one end of the downstream end part in the fin arrangement direction X; and a corner 307, which is in a form of a sharp corner (unrounded corner) and is located at the other end of the downstream end part in the fin arrangement direction X.

According to the configuration of this modification, the separation of the heat medium in the vicinity of each of the corners 306, 307 of the fin 30 can be reduced, so that the heat transfer surface area of the fin 30 relative to the heat medium can be increased. As a result, the heat exchange performance of the heat exchanger 10 can be improved.

(Third Modification)

Next, the heat exchanger 10 of a third modification will be described.

Figure 9:
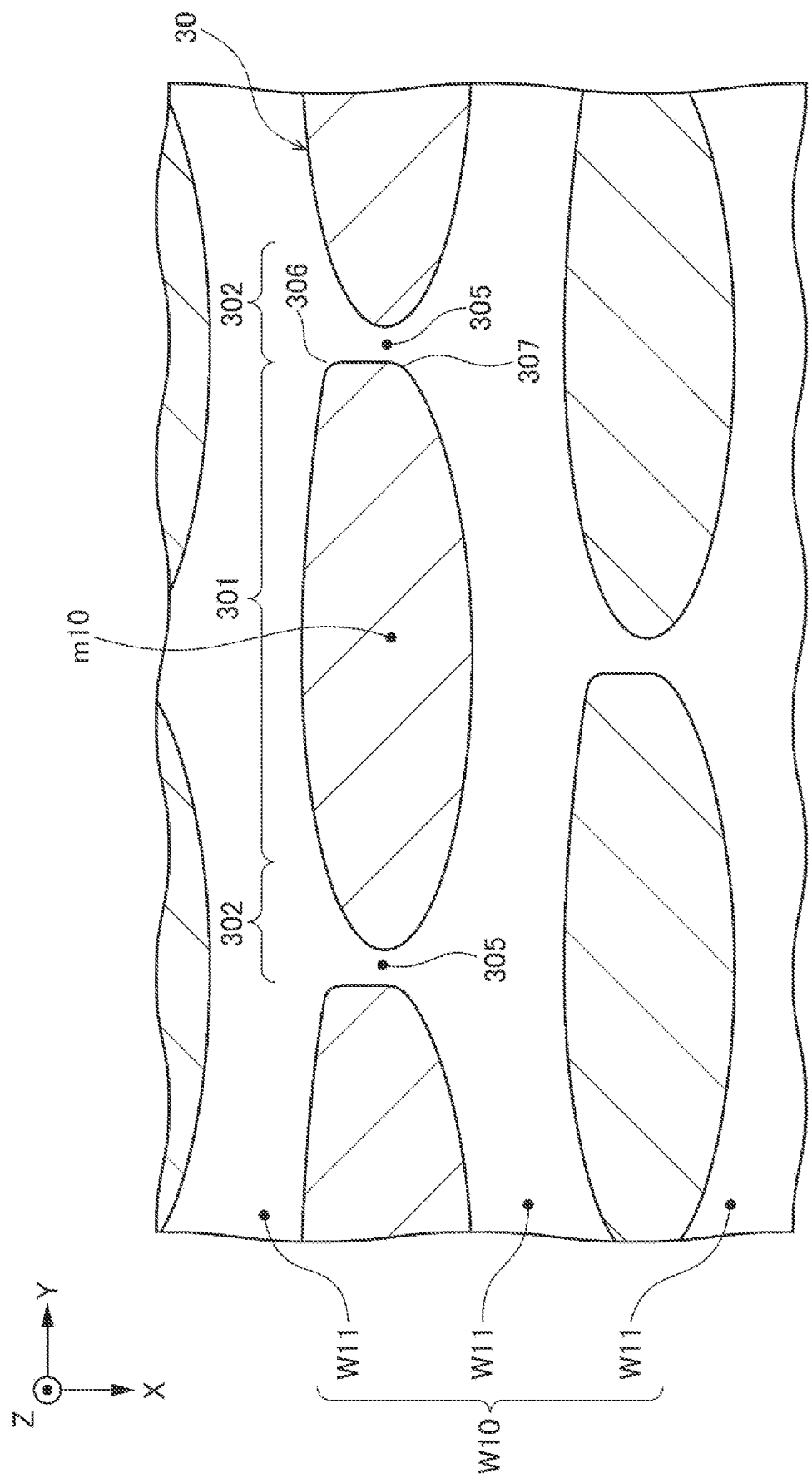
FIG. 9 is a cross-sectional view showing a structure of a fin according to a third modification of the second embodiment.

As shown in FIG. 9, in each of the fins 30 of this modification, each interposed portion, which is located between corresponding adjacent two of the communication passages 305, has a shape that is not line-symmetric with respect the axis m10 that extends through a center of the interposed portion and is parallel with the fin height direction Z. Specifically, in each of the fins 30, each interposed portion, which is located between the corresponding adjacent two of the communication passages 305, has a downstream end part located on the downstream side in the passage longitudinal direction Y, and this downstream end part has: a corner 306, which in a form of a sharp corner (unrounded corner) and is located at one end of the downstream end part in the fin arrangement direction X; and a corner 307, which has a round shape (rounded corner) and is located at the other end of the downstream end part in the fin arrangement direction X.

According to the configuration of the present modification, a flow velocity of the heat medium, which flows in the narrow passage W11 along the corner 306 in the form of the sharp corner, is higher than a flow velocity of the heat medium flowing in the narrow passage W11 along the corner 307 having the round shape. Therefore, a flow of the heat medium is likely to be formed from the one narrow passage W11, which is adjacent to the corner 306 in the form of the sharp corner, toward the other narrow passage W11, which is adjacent to the corner 307 having the round shape, through the communication passage 305. Thus, the stagnation of the heat medium in the vicinity of the communication passage 305 is less likely to be formed. As a result, it is possible to limit the deterioration in the heat transfer performance of the heat medium.

(Fourth Modification)

Next, the heat exchanger 10 of a fourth modification will be described.

Figure 10:
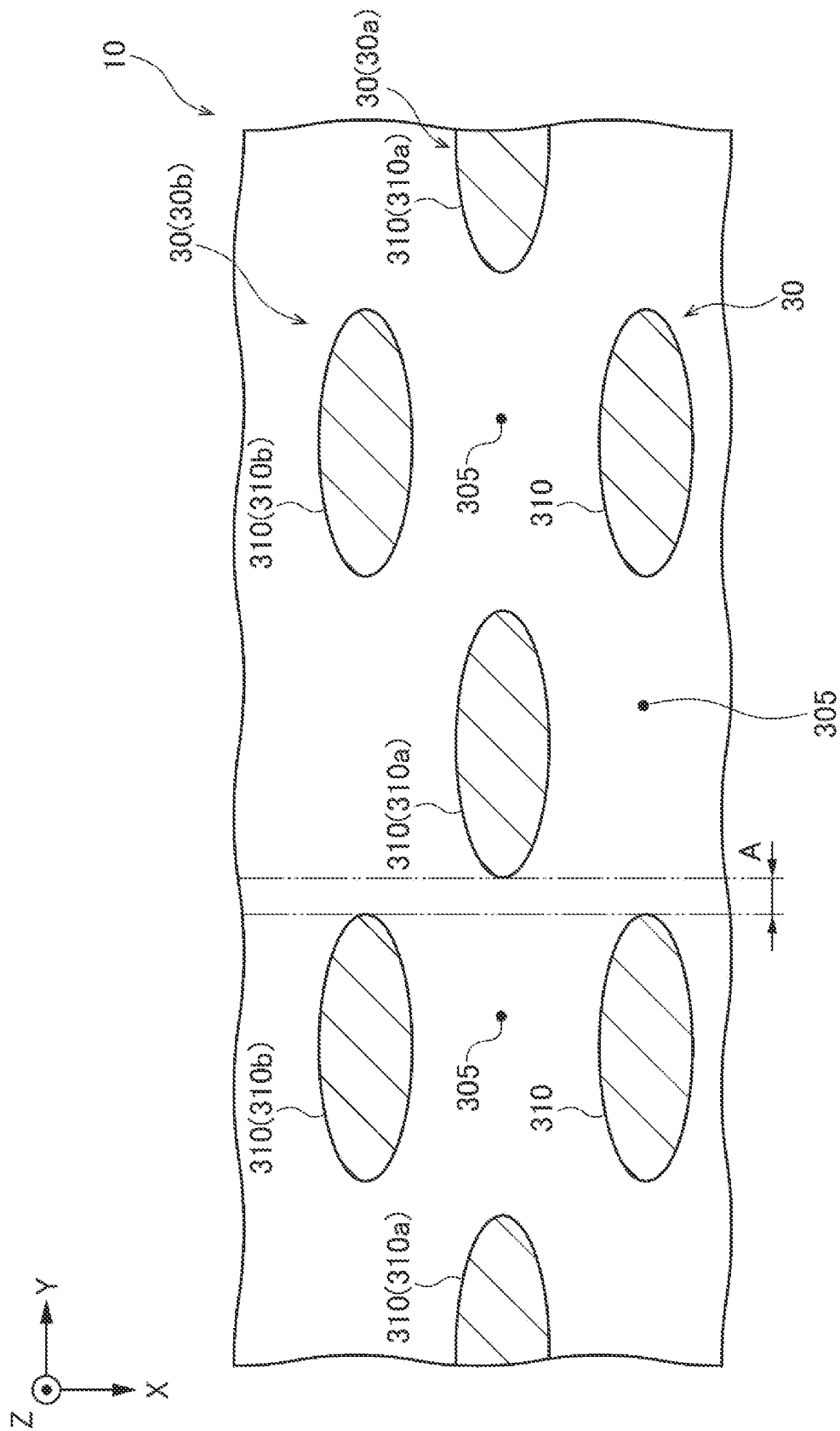
FIG. 10 is a cross-sectional view showing a structure of a fin according to a fourth modification of the second embodiment.

With reference to FIG. 10, in this modification, in each of the fins 30, each interposed portion, which is located between the corresponding adjacent two of the communication passages 305, is referred to as a fin piece 310. As shown in FIG. 10, in a case where there is a region A in which the fin pieces 310a, 310b of the adjacent fins 30a, 30b do not overlap with each other in the fin arrangement direction X, the cross-sectional area of the flow passage for the heat medium in the region A is increased rapidly. As a result, since the heat medium tends to flow by the inertia in the region A, the separation and stagnation of the heat medium tends to occur on the downstream side of the fin piece 310 in the flow direction of the heat medium. This may result in a deterioration in the heat transfer performance of the fins 30.

Figure 11:
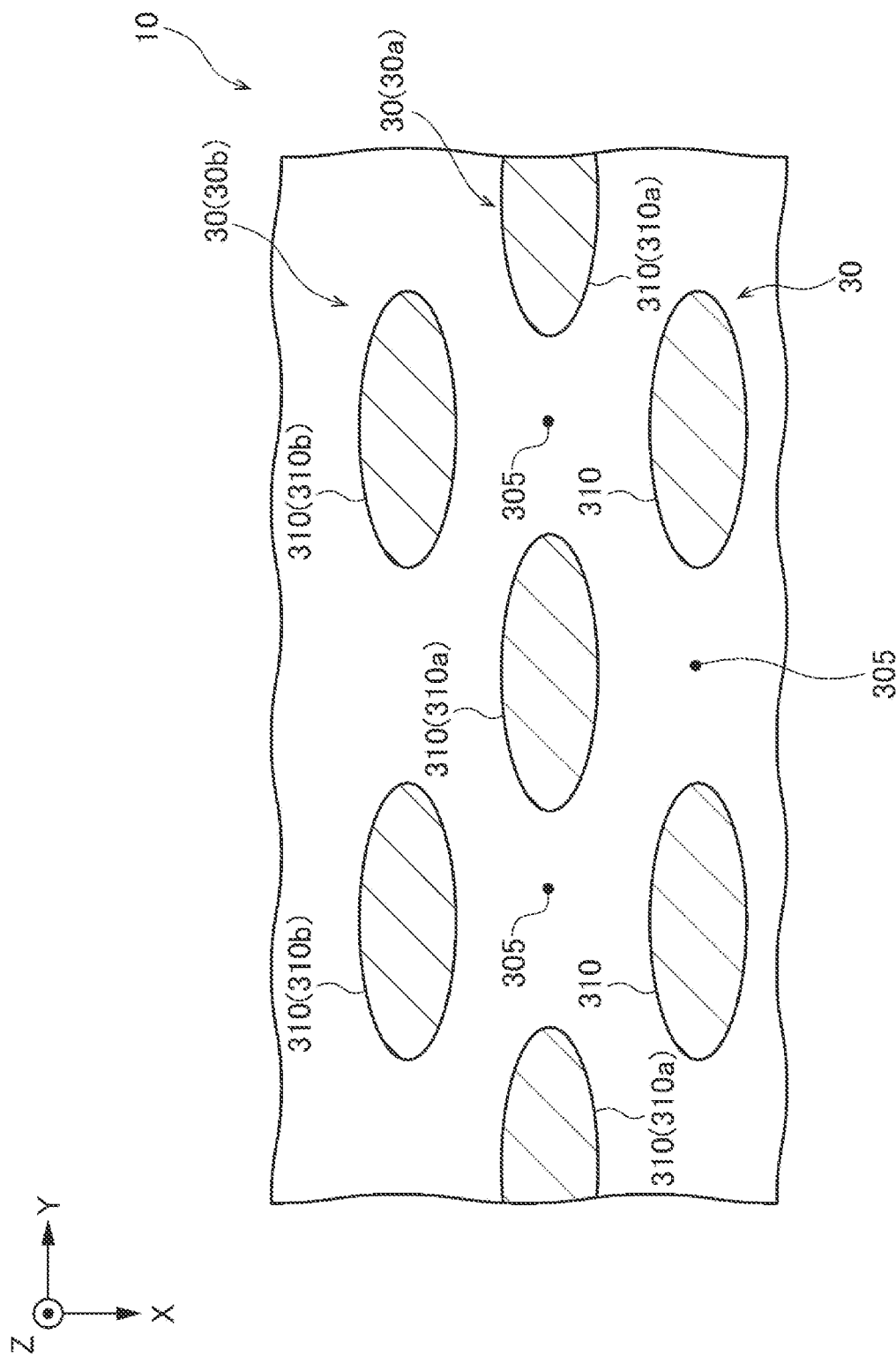
FIG. 11 is a cross-sectional view showing the structure of the fin according to the fourth modification of the second embodiment.

In view of this point, as shown in FIG. 11, it is desirable that the fin pieces 310a, 310b of the adjacent fins 30a, 30b are arranged to overlap with each other in the fin arrangement direction X. According to this configuration, since the rapid increase in the cross-sectional area of the flow passage for the heat medium can be limited, the separation and the stagnation of the heat medium at the fin pieces 310 are less likely to be generated. Therefore, the heat transfer performance of the fins 30 can be improved.

Third Embodiment

Next, the heat exchanger 10 of a third embodiment will be described. The following description focuses on the differences relative to the heat exchanger 10 of the first embodiment.

Figure 12:
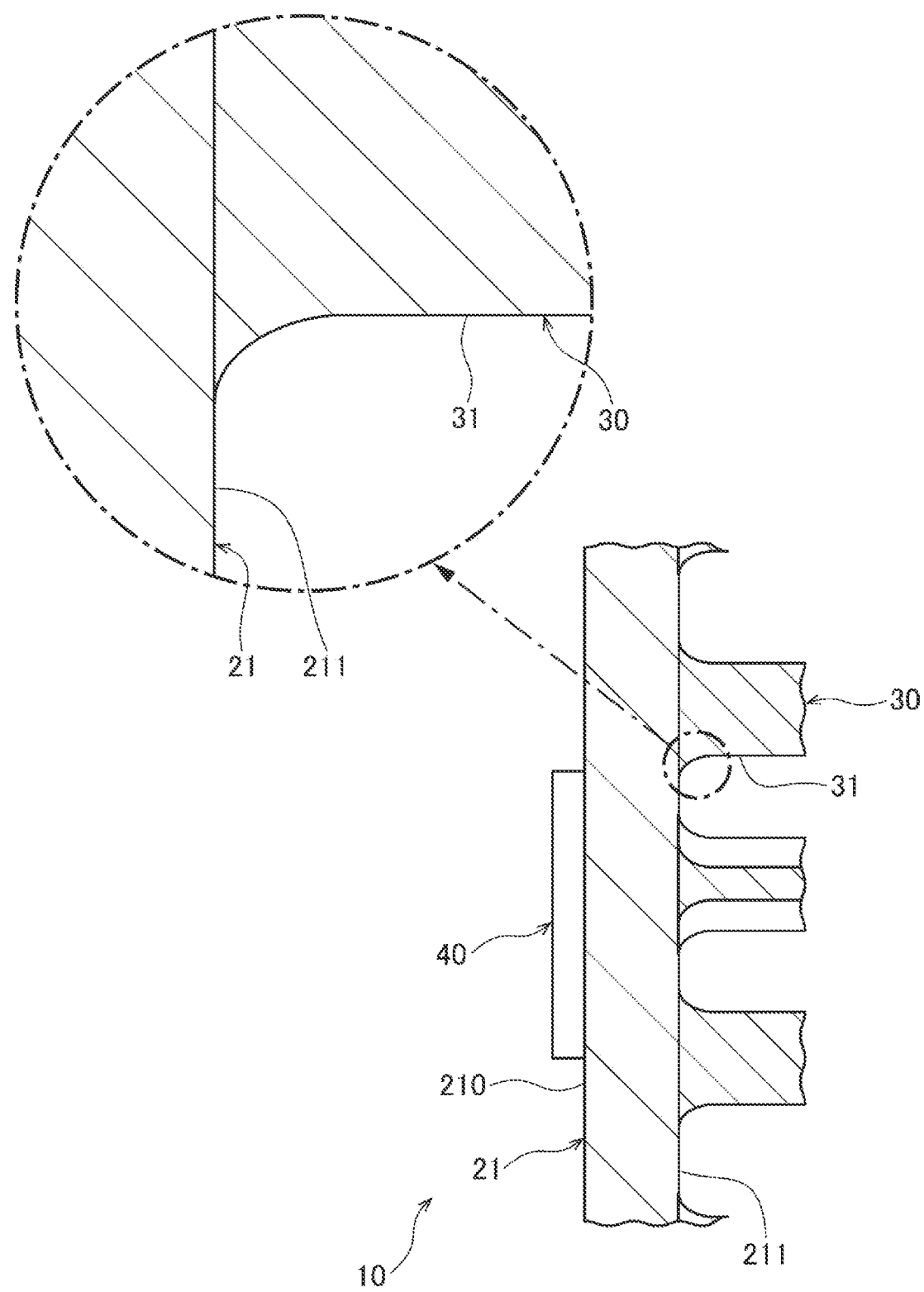
FIG. 12 is a cross-sectional view showing a structure of a heat exchanger according to a third embodiment.
Figure 13:
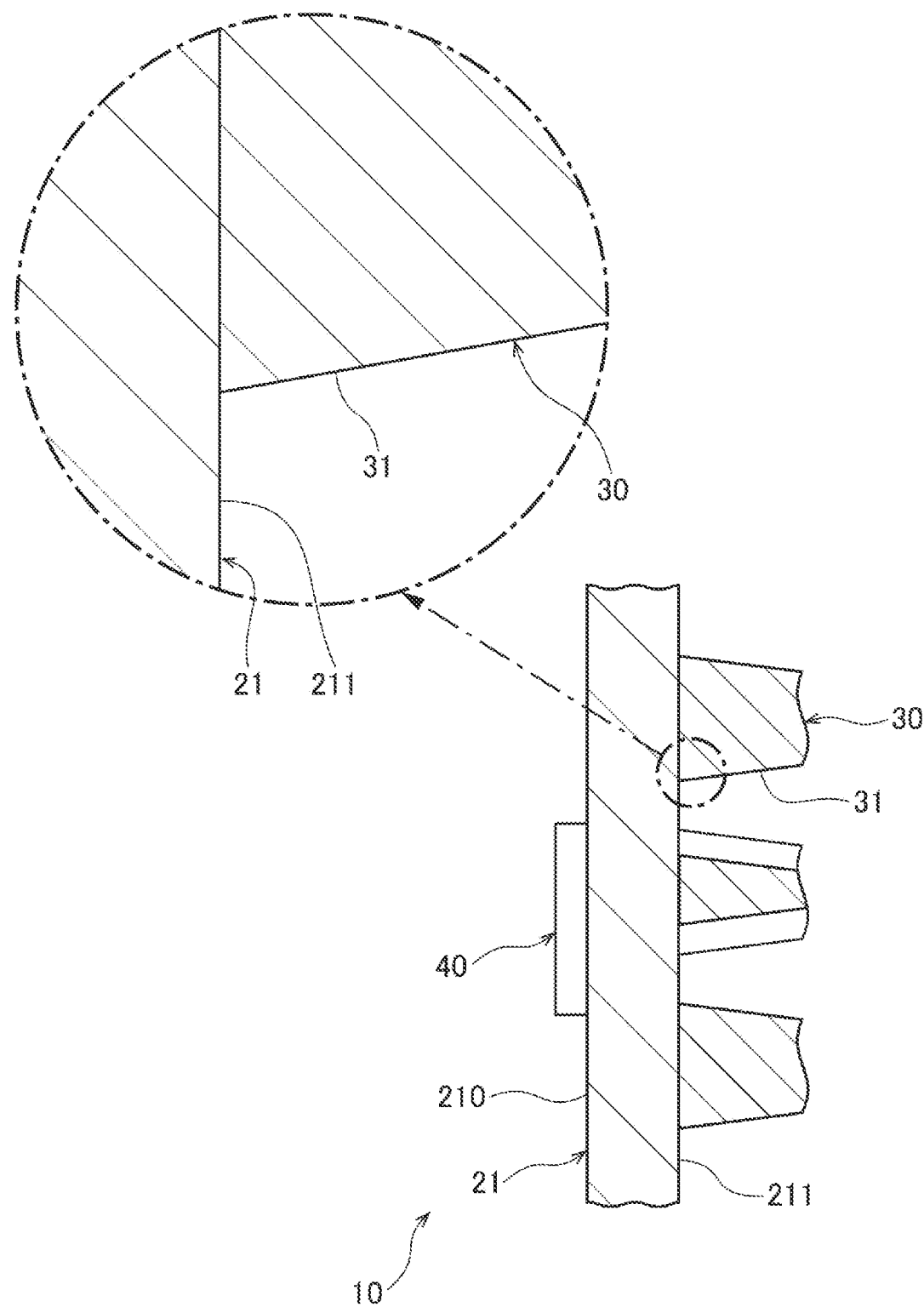
FIG. 13 is a cross-sectional view showing the structure of the heat exchanger according to the third embodiment.

As shown in FIG. 12, in the present embodiment, a peripheral wall of the one end portion 31 of each fin 30 has a round shape. Alternatively, as shown in FIG. 13, the peripheral wall of the one end portion 31 of each fin 30 may have a tapered shape to set a draft angle.

According to the heat exchanger 10 of the present embodiment described above, the following action and effect indicated at the following section (9) can be achieved.

(9) Since the heat can be easily conducted from the fins 30 to the first base 21, the fin efficiency of the fins 30 can be improved. As a result, the heat exchange performance of the heat exchanger 10 can be improved.

Fourth Embodiment

Next, the heat exchanger 10 of a fourth embodiment will be described. The following description focuses on the differences relative to the heat exchanger 10 of the first embodiment.

Figure 14:
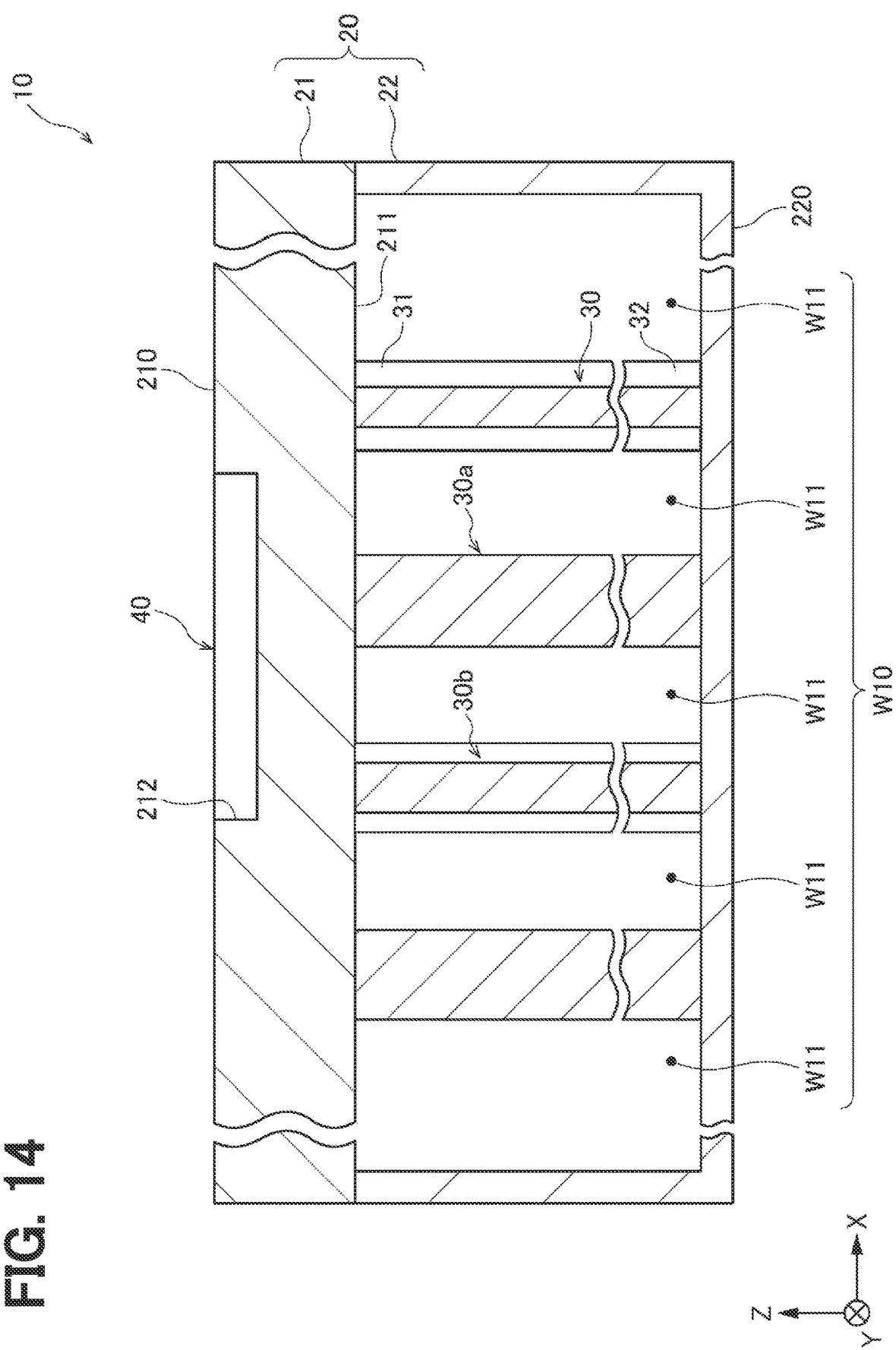
FIG. 14 is a cross-sectional view showing a structure of a heat exchanger according to a fourth embodiment.
Figure 15:
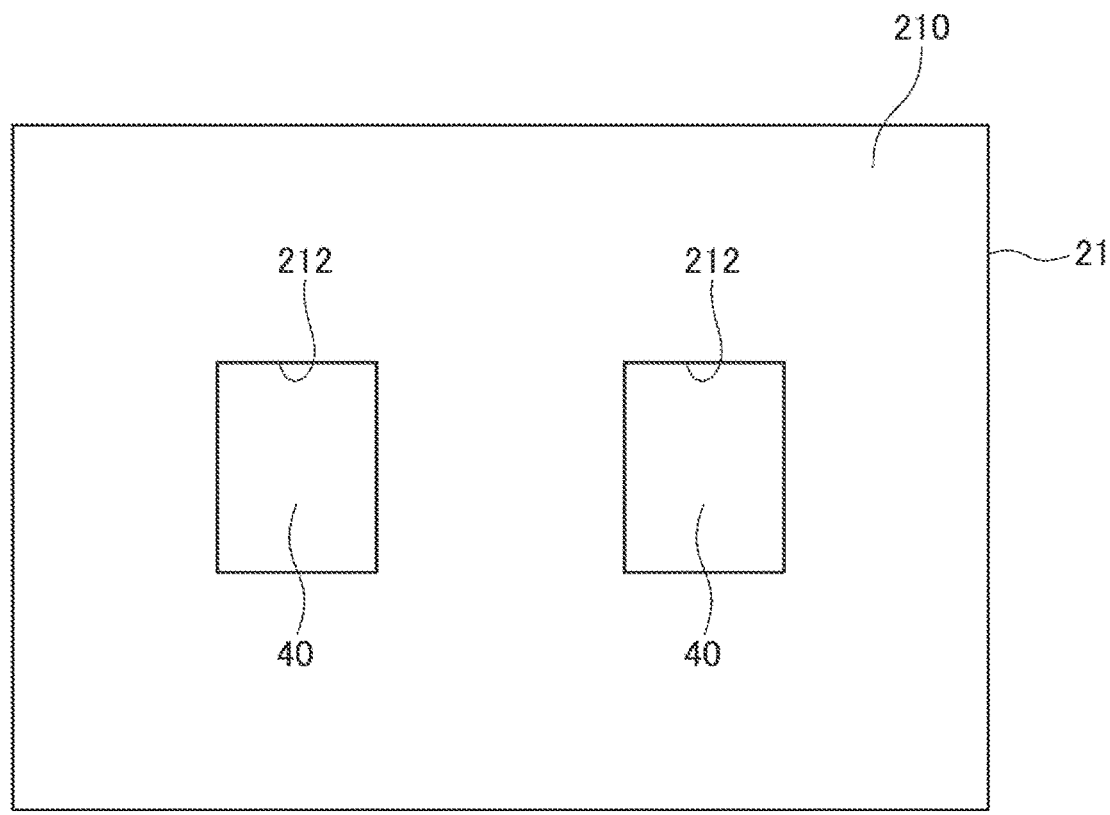
FIG. 15 is a plan view showing the structure of the heat exchanger according to the fourth embodiment.

As shown in FIG. 14, in the heat exchanger 10 of the present embodiment, a plurality of insertion grooves 212, each of which is in a form of a recess, are formed at the outer surface 210 of the first base 21. Specifically, as shown in FIG. 15, the number of the insertion grooves 212 is two, and these insertion grooves 212 are arranged in the passage longitudinal direction Y along the outer surface 210 of the first base 21. Two semiconductor devices 40, which are formed separately from each other, are respectively inserted into the two insertion grooves 212.

According to the heat exchanger 10 of the present embodiment described above, the following action and effect indicated at the following section (10) can be achieved.

(10) As in the present embodiment, when the insertion grooves 212, into which the semiconductor devices 40 can be respectively inserted, are formed at the outer surface 210 of the first base 21, the installation of the semiconductor devices 40 to the first base 21 is eased.

(Modification)

Next, a first modification of the heat exchanger 10 of the fourth embodiment will be described.

Figure 16:
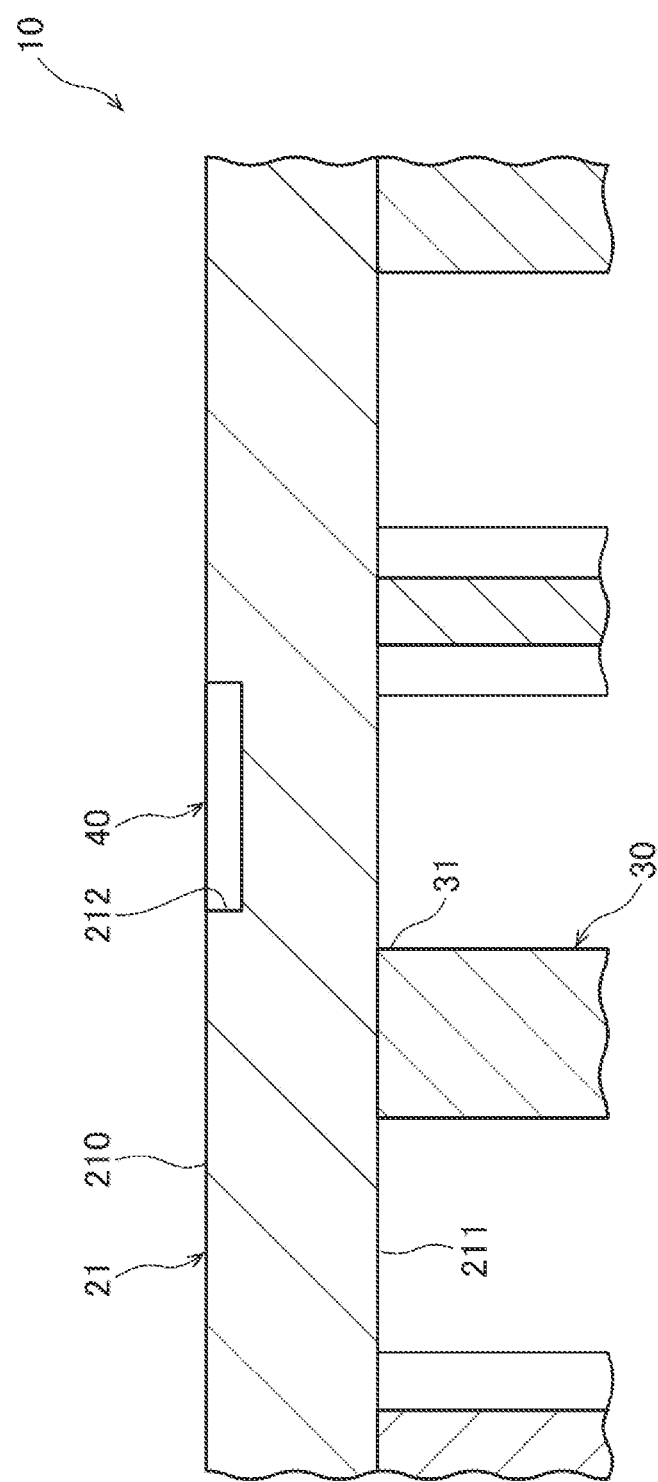
FIG. 16 is a plan view showing the structure of the heat exchanger according to the fourth embodiment.

As shown in FIG. 16, in the heat exchanger 10, the fin 30 may not be opposed to the semiconductor device 40 in the fin height direction Z.

Figure 17:
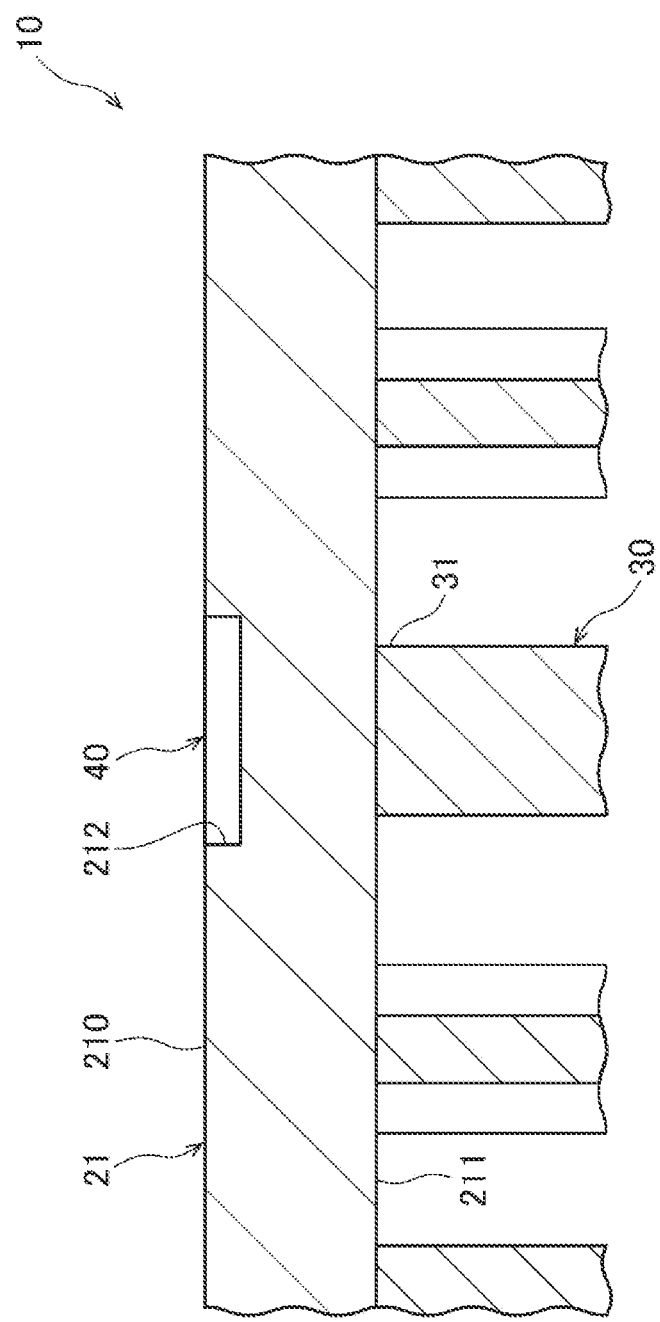
FIG. 17 is a plan view showing a structure of a heat exchanger according to a modification of the fourth embodiment.

In the case of the structure shown in FIG. 16, the heat transfer performance of the fins 30 relative to the semiconductor device 40 may possibly be deteriorated. In view of this point, as shown in FIG. 17, in the heat exchanger 10, the fin(s) 30 may be opposed to the semiconductor device 40 in the fin height direction Z.

Fifth Embodiment

Next, the heat exchanger 10 of a fifth embodiment will be described. The following description focuses on the differences relative to the heat exchanger 10 of the second embodiment.

The inventors of the present application have conducted experiments and have obtained suitable dimensions of the heat exchanger 10 which can enhance the heat transfer performance of the heat exchanger 10 in the case where the communication passages 305 are formed at the respective fins 30 as in the heat exchanger 10 of the second embodiment. The experiments conducted by the inventors will be specifically described below.

Figure 18:
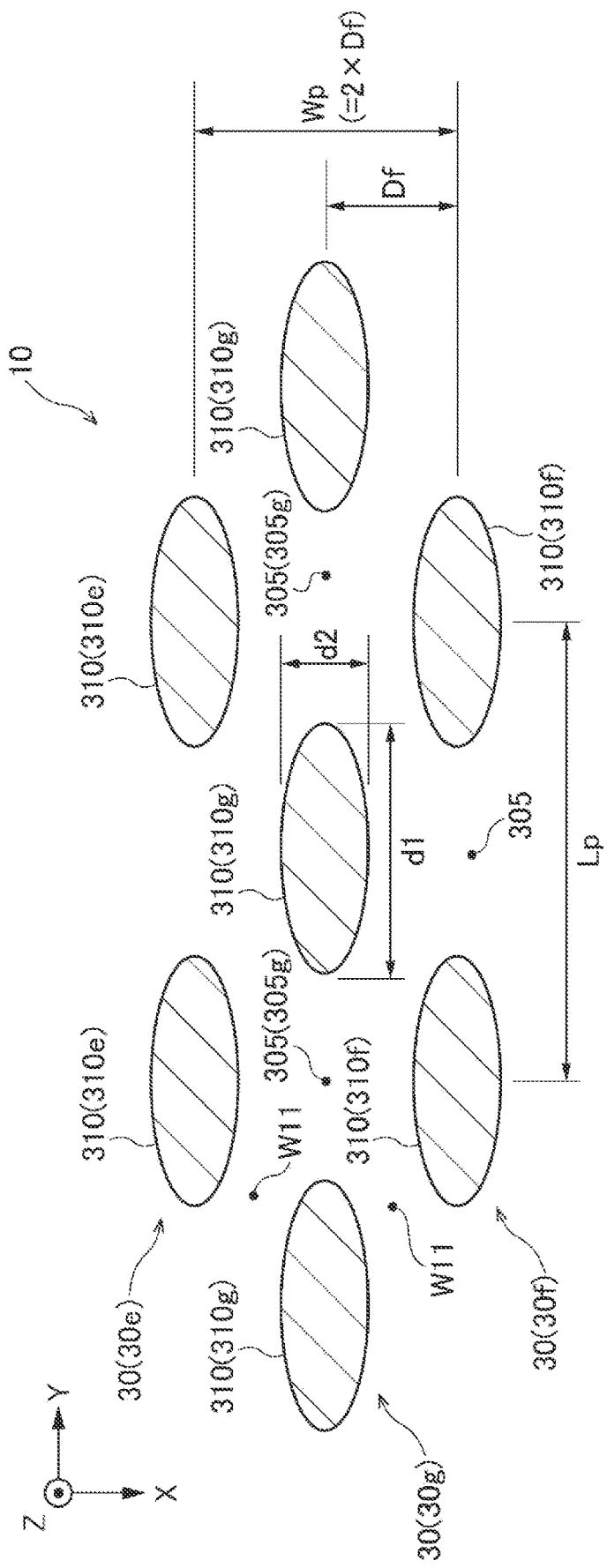
FIG. 18 is a cross-sectional view showing a structure of a fin according to a fifth embodiment.

In the heat exchanger 10 of the present embodiment shown in FIG. 18, the fins 30 are arranged at a predetermined interval Df in the fin arrangement direction X. Hereinafter, the interval Df will be referred to as a fin pitch. Each of the fins 30 has the communication passages 305 that are arranged at a predetermined interval in the passage longitudinal direction Y. Each of the fins 30 includes a plurality of fin pieces 310 each of which is located between adjacent two of the communication passages 305 of the fin 30. A shape of the cross-section of each fin piece 310, which is perpendicular to the fin height direction Z, is an ellipse that has a major axis, which extends in the passage longitudinal direction Y, and a minor axis, which extends in the fin arrangement direction X. Specifically, each fin piece 310 is shaped in an elongated form where a length of the fin piece 310 measured in the passage longitudinal direction Y is larger than a length of the fin piece 310 measured in the fin arrangement direction X. The fin pieces 310 are arranged at the predetermined interval Lp in the passage longitudinal direction Y.

Here, a fin, which is located on one side of a predetermined fin 30g in the fin arrangement direction X, will be referred to as a first adjacent fin 30e, and another fin, which is located on the other side of the predetermined fin 30g in the fin arrangement direction X, will be referred to as a second adjacent fin 30f. In such a case, each of fin pieces 310e of the first adjacent fin 30e is displaced from an adjacent one of fin pieces 310g of the predetermined fin 30g by Lp/2 in the passage longitudinal direction Y. Also, each of fin pieces 310f of the second adjacent fin 30f is displaced from an adjacent one of the fin pieces 310g of the predetermined fin 30g by Lp/2 in the passage longitudinal direction Y. Each of the fin pieces 310e of the first adjacent fin 30e is opposed to a corresponding one of the fin pieces 310f of the second adjacent fin 30f in the fin arrangement direction X while a corresponding one of the communication passages 305g of the predetermined fin 30g is interposed between these fin pieces 310e, 310f in the fin arrangement direction X.

In this heat exchanger 10, when the communication passages 305 are formed in each fin 30, the flow of the heat medium is generated in the respective communication passages 305 by a static pressure difference generated by a flow velocity difference between the two adjacent narrow passages W11, which are located on one side and the other side of the fin 30. Since the stagnation of the heat medium is eliminated by the flow of the heat medium in the communication passage 305, the heat transfer performance of the heat exchanger 10 is improved. According to this principle, it is assumed that when the size of each communication passage 305 is increased, the effect of eliminating the stagnation is increased, and thereby the heat transfer performance is improved. However, in reality, when the size of each communication passage 305 is increased, the heat transfer surface area of the fins 30 is reduced, and thereby the heat transfer performance is significantly deteriorated. As described above, with respect to the size of each communication passage 305, there is a trade-off between: the improvement in the heat transfer performance, which is realized by the elimination of the stagnation; and the decrease in the heat transfer surface area, which is caused by the decrease in the heat transfer surface area of the fin 30. As a result, with respect to the size of each communication passage 305, it is assumed that there is a specific size that results in a maximum value of the heat transfer performance of the heat exchanger 10.

Figure 19:
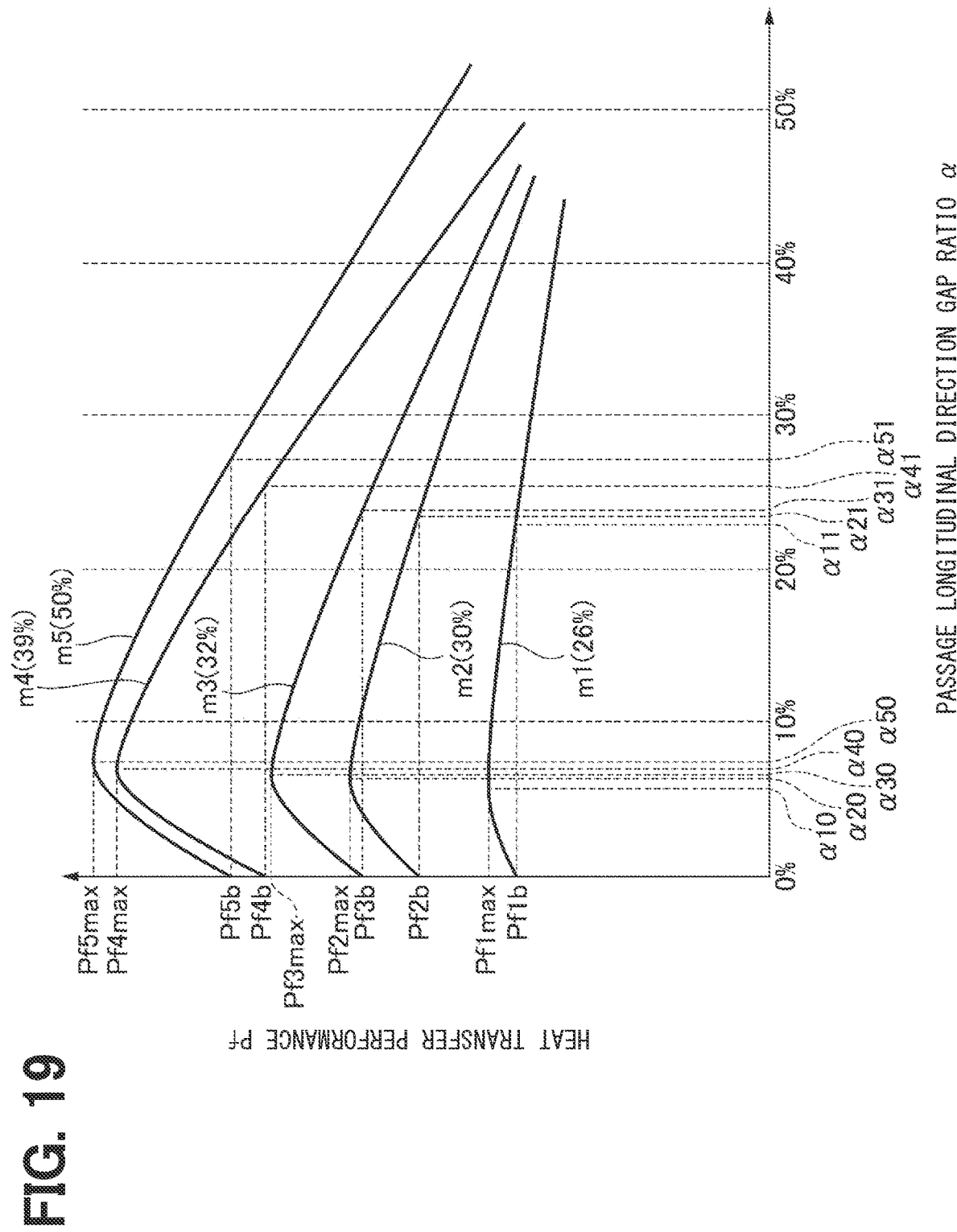
FIG. 19 is a graph showing a relationship between a passage longitudinal direction gap ratio $\alpha$ and a heat transfer performance $P_f$ of the heat exchanger according to the fifth embodiment.

Based on the above assumption, the heat transfer performance of the heat exchanger 10 is obtained through experiments while changing the lengths d1, Lp, d2, Wp shown in FIG. 18, and a graph shown in FIG. 19 is obtained from the result of the experiments. Here, d1 is a width of the fin piece 310 measured in the passage longitudinal direction Y. Also, Lp is a distance measured in the passage longitudinal direction Y between a center of one of adjacent two of the fin pieces 310 and a center of another one of the adjacent two of the fin pieces 310 in the fin 30 while a corresponding one of the communication passages 305 is interposed between the adjacent two of the fin pieces 310. Furthermore, d2 denotes a width of the fin piece 310 measured in the fin arrangement direction X. Additionally, Wp denotes a length that is twice longer than the fin pitch Df measured in the fin arrangement direction X. The graph shown in FIG. 19 indicates a relationship between a passage longitudinal direction gap ratio $\alpha$ ($=\{(Lp-d1)/Lp\} \times 100$) on a horizontal axis and a heat transfer performance Pf of the heat exchanger 10 on a vertical axis. Solid lines m1, m2, m3, m4, m5 shown in FIG. 19 indicate a change in the heat transfer performance Pf with respect to the passage longitudinal direction gap ratio $\alpha$ for cases where the fin arrangement direction occupancy factor $\beta$ ($=(d2/Wp) \times 100$) is 26 [%], 30 [%], 32 [%], 39 [%] and 50 [%], respectively.

The passage longitudinal direction gap ratio $\alpha$ is expressed as a percentage of the width of the communication passage 305 with respect to the arrangement interval Lp of the fin pieces 310 in the passage longitudinal direction Y. Therefore, it means that the width of the communication passage 305 measured in the passage longitudinal direction Y increases when the passage longitudinal direction gap ratio $\alpha$ is increased. In the graph shown in FIG. 19, a value, which is obtained when the clearance ratio $\alpha$ is 0 [%], corresponds to a value, which is obtained when the fin having no communication passage 305 is used.

As shown in FIG. 19, when the passage longitudinal direction gap ratio α is increased from 0 [%], the heat transfer performance Pf of the heat exchanger 10 is gradually increased to a maximum value and is then decreased. Therefore, there is a range in which the heat transfer performance Pf is higher in comparison to the case where the passage longitudinal direction gap ratio α is 0 [%], i.e., the case where the communication passage 305 is not formed in the fin 30. For example, in the case where the fin arrangement direction occupancy ratio β is 26 [%], when the passage longitudinal direction gap ratio α is increased from 0 [%], the heat transfer performance Pf is increased from a reference heat transfer performance Pf1b, which is the heat transfer performance Pf obtained at 0 [%] of the passage longitudinal direction gap ratio α, and this heat transfer performance Pf reaches a maximum value Pf1max when the passage longitudinal direction gap ratio α reaches a predetermined value α10. Then, when the passage longitudinal direction gap ratio α is further increased from the predetermined value α10, the heat transfer performance Pf is decreased. Thereafter, when the passage longitudinal direction gap ratio α reaches a threshold value α11 the heat transfer performance Pf becomes the reference heat transfer performance Pf1b. Furthermore, when the passage longitudinal direction gap ratio α is further increased, the heat transfer performance Pf is decreased below the reference heat transfer performance Pf1b. Therefore, as long as the passage longitudinal direction gap ratio α satisfies 1, it is possible to ensure that the heat transfer performance is equal to or higher than the reference heat transfer performance Pf1b.

The same applies to the cases where the fin arrangement direction occupancy ratio β is 30 [%], 32 [%], 39 [%] and 50 [%], respectively. In FIG. 19, with respect to these cases, the passage longitudinal direction gap ratios α, at which the heat transfer performance Pf becomes the maximum values Pf2max, Pf3max, Pf4max and Pf5max, respectively, are indicated by predetermined values α20, α30, α40 and α50, respectively. Furthermore, the passage longitudinal direction gap ratios α, at which the reference heat transfer performances Pf2b, Pf3b, Pf4b and Pf5b are respectively achieved, are indicated by threshold values α21, α31, α41 and α51, respectively.

Figure 20:
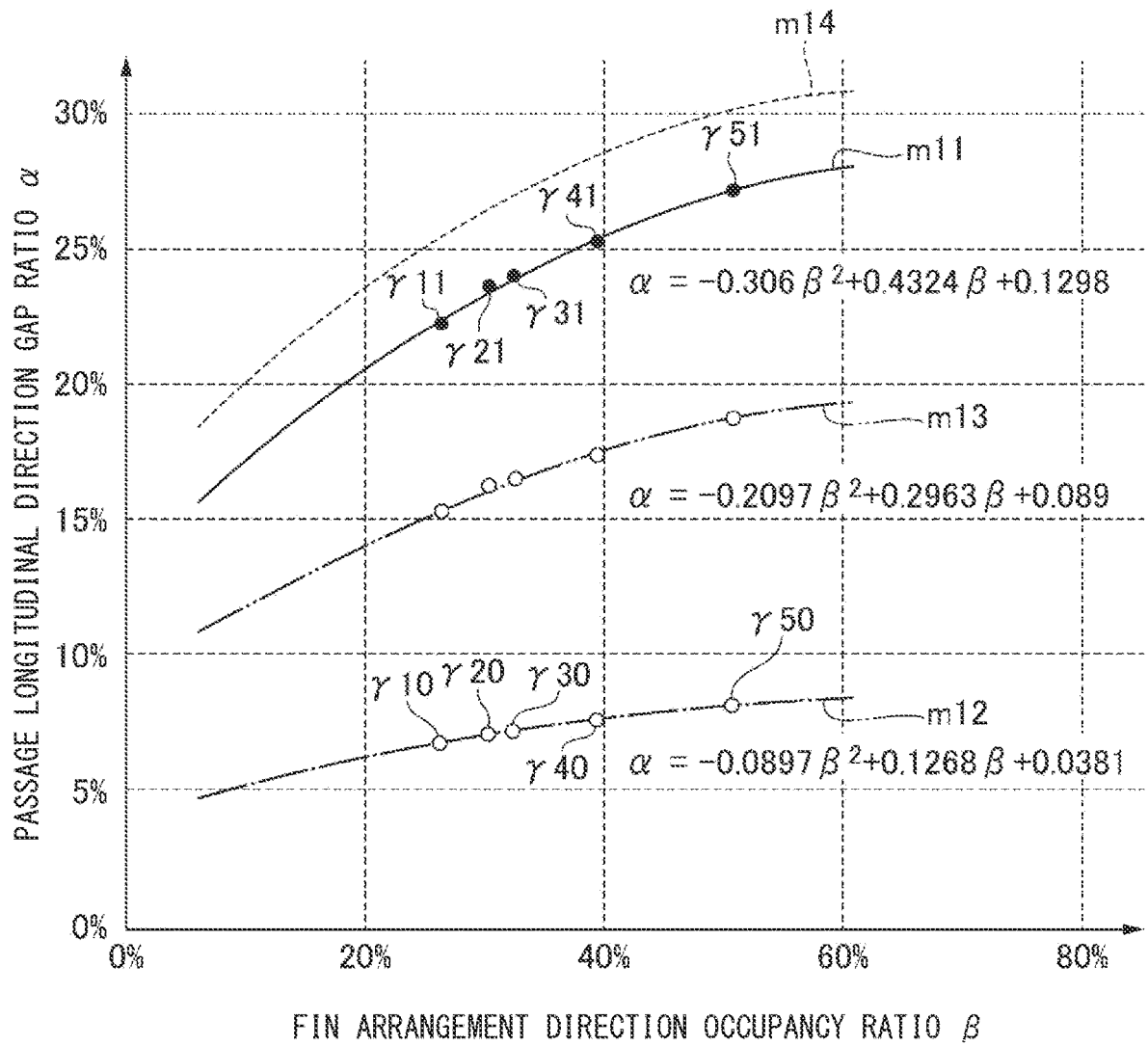
FIG. 20 is a graph showing a relationship between a fin arrangement direction occupancy ratio $\beta$ and the passage longitudinal direction gap ratio $\alpha$ of the heat exchanger according to the fifth embodiment.

In FIG. 20, the relationships between the values α11, α21, α31, α41 and α51 of the passage longitudinal direction gap ratio α shown in FIG. 19 and the corresponding values [26%], [30%], [32%], [39%] and [50%] of the fin arrangement direction occupancy ratio β are indicated at points γ11γ21, γ31, γ41 and γ51, respectively. When an approximate equation for a curve, which passes through these points γ11, γ21, γ31, γ41, and γ51, is elaborated, the following equation f1 is obtained. In FIG. 20, the curve, which corresponds to this equation f1, is indicated by a solid line m11.

$$\alpha = -0.306\beta^2 + 0.4324\cdot\beta + 0.1298 \quad (f1)$$

According to the relationship between the passage longitudinal direction gap ratio α and the heat transfer performance Pf shown in FIG. 19, when the passage longitudinal direction gap ratio α and the fin arrangement direction occupancy ratio β are set in a range, which satisfies the following equation f2, it is possible to obtain the heat transfer performance, which is equal to or higher than the reference heat transfer performance, i.e., the heat transfer performance, which is equal to or higher the heat transfer performance that can be obtained in the case where the communication passages 305 are not formed.

$$\alpha \leq 0.306\cdot\beta^2 + 0.4324\cdot\beta + 0.1298 \quad (f2)$$

In summary, when the values of d1, Lp, d2 and Wp shown in FIG. 18 satisfy the following equation f3, it is possible to obtain the heat transfer performance, which is equal to or higher the heat transfer performance that can be obtained in the case where the communication passages 305 are not formed.

$$(Lp-d1)/Lp \leq 0.306(d2/Wp)^2 + 0.4324(d2/Wp) + 0.1298 \quad (f3)$$

In FIG. 20, the relationships between the values α10, α20, α30, α40 and α50 of the passage longitudinal direction gap ratio α shown in FIG. 19 and the corresponding values [26%], [30%], [32%], [39%] and [50%] of the fin arrangement direction occupancy ratio β are indicated at points γ10, γ20, γ30, γ40 and γ50, respectively. When an approximate equation for a curve, which passes through these points γ10, γ20, γ30, γ40, and γ50, is elaborated, the following equation f4 is obtained. In FIG. 20, the curve, which corresponds to this equation f4, is indicated by a dot-dash line m12.

$$\alpha = -0.0897\cdot\beta^2 + 0.1268\cdot\beta + 0.0381 \quad (f4)$$

Therefore, when the values of d1, Lp, d2 and Wp shown in FIG. 18 satisfy the following equation f5, the heat transfer performance of the heat exchanger 10 can be maximized.

$$(Lp-d1)/Lp = -0.0897(d2/Wp)^2 + 0.1268(d2/Wp) + 0.0381 \quad (f5)$$

In a case where the reference heat transfer performance, which is obtained by using the solid line m11 shown in FIG. 20, is denoted by Pfb, and the maximum heat transfer performance, which is obtained by using the dot-dash line m12 shown in FIG. 20, is denoted by Pfmax, when the values of d1, Lp, d2 and Wp shown in FIG. 18 satisfy the following equation f6, the heat transfer performance of (Pfmax−Pfb)/2 can be obtained. In FIG. 20, the curve, which corresponds to this equation f6, is indicated by a dot-dot-dash line m13.

$$(Lp-d1)/L \leq -0.2097(d2/Wp)^2 + 0.2963(d2/Wp) + 0.089 \quad (f6)$$

According to the heat exchanger 10 of the present embodiment described above, the following actions and effects indicated at the following sections (11) and (12) can be achieved.

(11) The values of d1, Lp, d2 and Wp shown in FIG. 18 are set to satisfy the above equation f3. This makes it possible to obtain the heat transfer performance, which is equal to or higher than the heat transfer performance that is obtained when the communication passages 305 are not formed.

(12) The values of d1, Lp, d2 and Wp shown in FIG. 18 are set to satisfy the above equation f5. This makes it possible to maximize the heat transfer performance of the heat exchanger 10.

(Modifications)

Next, modifications of the heat exchanger 10 of the fifth embodiment will be described.

The shape of the respective fin pieces 310 may be changed arbitrarily. However, in order to facilitate the formation of the meandering flow of the heat medium, it is effective that the fin pieces 310 respectively have the elongated shape in which the length measured in the passage longitudinal direction Y is longer than the length measured in the fin arrangement direction X. As an example of this elongated shape, the fin pieces 310 may be respectively formed in an oval shape (oblong shape) as shown in FIG. 21 or in a rhombic shape as shown in FIG. 22. When the fin pieces 310 are respectively formed in the oval or rhombic shape, the following actions and effects can be obtained.

As shown in (A) of FIG. 21, in the case where the cross-section of the respective fin pieces 310, which is perpendicular to the fin height direction Z, is formed in the oval shape, and the communication passages 305 are not formed in the fin 30, the heat medium is difficult to flow in the meandering form as compared with the case where the fin pieces formed in the ellipse shape shown in FIG. 2 are used. Therefore, when the fin pieces 310 are respectively formed in the oval shape, it is particularly effective to form the communication passages 305 in the fins 30 as shown in (B) of FIG. 21. According to such a configuration, the flow of the heat medium through the communication passages 305 makes it easy for the heat medium to form the meandering flow, and thereby the fin efficiency can be greatly improved. As described above, in the case where the fin pieces 310 respectively formed in the oval shape are used, since the flow of the heat medium greatly differs between the case where the communication passages 305 are present and the case where the communication passages 305 are not present, it is possible to expect that the fin efficiency is greatly improved by forming the communication passages 305.

As shown in (A) of FIG. 22, the cross-section of the respective fin pieces 310, which is perpendicular to the fin height direction Z, may be the rhombic shape. As shown in (A) of FIG. 22, in the case where the cross-section of the respective fin pieces 310, which is perpendicular to the fin height direction Z, is formed in the rhombic shape, and the communication passages 305 are not formed in the respective fins 30, the heat medium is more easily separated from the fin pieces 310 in comparison to the case where the fin pieces are respectively formed in the ellipse shape as shown in FIG. 2. Thus, in such a case, the stagnation of the heat medium easily occurs. This reduces the effective heat transfer surface area of the respective fins 30. In contrast, as shown in (B) of FIG. 22, when the communication passages 305 are formed in the fins 30, the flow of the heat medium through the communication passages 305 makes it difficult for the heat medium to separate from the fin pieces 310, so that the stagnation of the heat medium hardly occurs. Therefore, since the effective heat transfer surface area of the respective fins 30 can be increased, the fin efficiency can be improved.

In the case where the fin pieces 310 are respectively formed in the oval shape or the rhombic shape, a relational equation between the passage longitudinal direction gap ratio α and the fin arrangement direction occupancy ratio β, which can achieve the heat transfer performance equivalent to the heat transfer performance achieved in the case where the communication passages 305 are formed, is considered to be, for example, a relational equation indicated by a dotted line m14 in FIG. 20.

Other Embodiments

The above embodiments may be modified as follows.

In the heat exchanger 10 having the communication passages 305 formed in the fins 30 as shown in FIG. 5, the structure of FIG. 4, in which the gap is formed between the other end portion 32 of each fin 30 and the inner surface of the bottom wall 220 of the second base 22, may be used. According to this configuration, the heat medium can flow between the adjacent narrow passages W11 through the gap formed between the other end portion 32 of the fin 30 and the inner surface of the bottom wall 220 of the second base 22. The width of the respective communication passages 305 formed in the fins 30 varies due to, for example, the presence of the shape tolerance of the fins 30. This causes variations in the pressure loss among the narrow passages W11. In this regard, in the case where the heat medium can flow between the adjacent narrow passages W11 through the gap formed between the other end portion 32 of the fin 30 and the inner surface of the bottom wall 220 of the second base 22, even when the pressure loss varies among the narrow passages W11, the variation in the pressure loss is mitigated by the heat medium flowing between the adjacent narrow passage W11. Therefore, it is possible to improve the robustness of the pressure loss of each of the narrow passages W11.

The shape of the fin 30 in each of the above embodiments can be changed arbitrarily as long as the thick wall portions 301 and the thin wall portions 302 are alternately arranged in the passage longitudinal direction Y. Furthermore, the thick wall portions 301 and the thin wall portions 302 may be formed along a whole or a portion of each of the fins 30 in the passage longitudinal direction Y.

The passage longitudinal direction Y is not limited to the direction perpendicular to the fin arrangement direction X but may be a direction crossing the fin arrangement direction X.

The fins 30 of each of the above embodiments respectively have the thick wall portions 301 and the thin wall portions 302 alternately arranged in the passage longitudinal direction Y, and the outer surfaces of thick wall portions 301 and the thin wall portions 302 of the fin 30 are formed as the curved surfaces and extend continuously. Alternatively, the fin 30 may have a plurality of intermediate connections each of which connects between a corresponding one of the thick wall portions 301 and an adjacent one of the thin wall portions 302, and the intermediate connection is shaped to linearly connect between the curved outer surface of the thick wall portion 301 and the curved outer surface of the thin wall portion 302.

The surfaces 303, 304 of each fin 30 may be formed by not only the curved surface but also only a planar surface or a combination of planar and curved surfaces. That is, the surfaces 303, 304 of each fin 30 may be respectively formed as a non-curved surface or a combination of curved and non-curved surfaces.

In the respective fins 30 of each of the above embodiments, the portion having the plate wall thickness, which is larger than the average value of plate wall thicknesses in the fin 30 is defined as the thick wall portion 301, but the definition of the thick wall portion 301 is not limited to this. For example, a portion, which has a plate wall thickness larger than that of the other portion in the fin 30, may be defined as the thick wall portion 301. The same applies to the thin wall portion 302. In short, the fin 30 may have the thick wall portions 301, each of which has the relatively large plate wall thickness, and the thin wall portions 302, each of which has the relatively small plate wall thickness, and these thick wall portions 301 and the thin wall portions 302 are alternately arranged in the passage longitudinal direction Y.

The fin pieces 310 of the fifth embodiment shown in FIG. 18 may have the structure, in which the peripheral wall of the one end portion has the round shape, as shown in FIG. 12, or the structure in which the peripheral wall of the one end portion has the tapered shape, as shown in FIG. 13. When any one of these structures is employed, the width of the fin piece 310 changes in the fin height direction Z. At this time, the whole of the fin piece 310 in the fin height direction Z may satisfy the above equation f3, or a part of the fin piece 310 in the fin height direction Z may satisfy the above equation f3. In the former case, the action and effect discussed in the above section (11) can be achieved by the whole of the fin piece 310, and in the latter case, the action and effect discussed in the above section (11) can be achieved by the part of the fin piece 310. The same applies to the above equations f5 and f6.

The fins, each of which satisfies the above equation f3, and the fins, each of which does not satisfy the above equation f3, may be mixed in the fins 30 of the heat exchanger 10 of the fifth embodiment. In this case, since the action and effect discussed in the above section (11) can be obtained in the fins, which satisfy the above equation f3, the fin efficiency can be improved further in comparison to the previously proposed heat exchanger. The same applies to the above equations f5 and f6.

The heat exchanger 10 of each of the above embodiments is not limited to the one that exchanges the heat with the semiconductor device 40. That is, the heat exchanger 10 of each of the above embodiments may be a heat exchanger that exchange heat with any electronic component(s).

The present disclosure is not limited to the above specific examples. Appropriate design changes made by those skilled in the art to the above specific examples are also included in the scope of the present disclosure as long as they have the features of the present disclosure. Each element included in each specific example described above, and its arrangement, conditions, shape, etc., are not limited to those illustrated and can be changed as appropriate. As long as there is no technical contradiction, the combination of the elements included in the specific examples described above can be changed as appropriate.

What is claimed is:

1. A heat exchanger configured to exchange heat between a heat medium, which is conducted in a heat medium flow passage, and an electronic component, the heat exchanger comprising:
   a plurality of fins that are placed in the heat medium flow passage, wherein the plurality of fins are spaced from each other and are arranged in a predetermined direction, which is defined as a fin arrangement direction, to divide the heat medium flow passage into a plurality of narrow passages, wherein:
   the heat medium flow passage extends in a passage longitudinal direction which is a direction that intersects the fin arrangement direction;
   each of the plurality of fins includes a plurality of thick wall portions and a plurality of thin wall portions which are alternately arranged along a whole or a portion of the fin in the passage longitudinal direction, wherein a plate wall thickness of each of the plurality of thick wall portions is relatively large, and a plate wall thickness of each of the plurality of thin wall portions is relatively small;
   each adjacent two of the plurality of fins, which are adjacent to each other, are respectively defined as one fine and another fin, and each of the plurality of thick wall portions of the one fin is opposed to an adjacent one of the plurality of thin wall portions of the another fin in the fin arrangement direction, and each of the plurality of thin wall portions of the one fin is opposed to an adjacent one of the plurality of thick wall portions of the another fin in the fin arrangement direction;
   each of the plurality of fins has a communication passage that communicates between:
   one of the plurality of narrow passages located along one surface of the fin; and
   another one of the plurality of narrow passages located along another surface of the fin;
   the communication passage is one of a plurality of communication passages that are arranged at a predetermined interval in the passage longitudinal direction in each of the plurality of fins;
   each of the plurality of fins includes a plurality of fin pieces each of which is located between adjacent two of the plurality of communication passages of the fin;
   in each of the plurality of fins, each of the plurality of fin pieces is shaped in an elongated form, wherein a length of each of the plurality of fin pieces measured in the passage longitudinal direction is larger than a length of each of the plurality of fin pieces measured in the fin arrangement direction;
   each of the plurality of fin pieces of each of the plurality of fins is configured to satisfy the following equation:

$(Lp-d1)/Lp \le -0.306(d2/Wp)^2 + 0.4324(d2/Wp) + 0.1298$, where:
   d1 denotes a width of each of the plurality of fin pieces measured in the passage longitudinal direction in each of the plurality of fins;
   Lp denotes a distance measured in the passage longitudinal direction between a center of one of adjacent two of the plurality of fin pieces and a center of another one of the adjacent two of the plurality of fin pieces in each of the plurality of fins, wherein a corresponding one of the plurality of communication passages is interposed between the adjacent two of the plurality of fin pieces;
   d2 denotes a width of each of the plurality of fin pieces measured in the fin arrangement direction in each of the plurality of fins; and
   Wp denotes a length that is twice longer than a fin pitch which is an interval of the plurality of fins in the fin arrangement direction.

2. The heat exchanger according to claim 1, wherein:
   in each of the plurality of fins, a thickest part of each of the plurality of thick wall portions, which has a largest plate wall thickness in the thick wall portion, is defined as a thickest wall part, and a thinnest part of each of the plurality of thin wall portions, which has a smallest plate wall thickness in the thin wall portion, is defined as a thinnest wall part;
   in each of the plurality of fins, the thickest wall parts of the plurality of thick wall portions are arranged at a predetermined pitch in the passage longitudinal direction, and the thinnest wall parts of the plurality of thin wall portions are arranged at the predetermined pitch in the passage longitudinal direction;
   each of the thickest wall parts of the plurality of thick wall portions of the one fin is displaced from an adjacent one of the thickest wall parts of the plurality of thick wall portions of the another fin by a half of the predetermined pitch in the passage longitudinal direction; and
   each of the thinnest wall parts of the plurality of thin wall portions of the one fin is displaced from an adjacent one of the thinnest wall parts of the plurality of thin wall portions of the another fin by the half of the predetermined pitch in the passage longitudinal direction.

3. The heat exchanger according to claim 1, wherein the one surface and the another surface of each of the plurality of fins, which respectively face the one and the another one of the plurality of narrow passages, are respectively formed as a curved surface.

4. The heat exchanger according to claim 1, wherein the one surface and the another surface of each of the plurality of fins, which respectively face the one and the another one of the plurality of narrow passages, are respectively formed as a non-curved surface.

5. The heat exchanger according to claim 1, wherein each of the plurality of fin pieces of the one fin and an adjacent one of the plurality of fin pieces of the another fin are placed on one side and another side of a corresponding one of the plurality of narrow passages and overlap with each other in the fin arrangement direction.

6. The heat exchanger according to claim 1, wherein:
a direction, which is perpendicular to both of the passage longitudinal direction and the fin arrangement direction, is defined as a fin height direction; and
the heat exchanger comprises a base, wherein the electronic component is installed to one of two opposite surfaces of the base, and one end portion of each of the plurality of fins in the fin height direction is fixed to another one of the two opposite surfaces of the base.

7. The heat exchanger according to claim 6, wherein the one of the two opposite surfaces of the base has an insertion groove, which is in a form of a recess and receives the electronic component.

8. The heat exchanger according to claim 6, wherein a peripheral wall of the one end portion of each of the plurality of fins, which is fixed to the another one of the two opposite surfaces of the base, has a tapered shape.

9. The heat exchanger according to claim 6, wherein a peripheral wall of the one end portion of each of the plurality of fins, which is fixed to the another one of the two opposite surfaces of the base, has a round shape.

10. The heat exchanger according to claim 1, wherein:
a direction, which is perpendicular to both of the passage longitudinal direction and the fin arrangement direction, is defined as a fin height direction, and in each of the plurality of fins, a thinnest part of each of the plurality of thin wall portions, which has a smallest plate wall thickness in the thin wall portion, is defined as a thinnest wall part; and
in each of the plurality of fins, an interposed portion, which is located between corresponding adjacent two of the thinnest wall parts of the plurality of thin wall portions in the fin, has a shape that is line-symmetric with respect an axis which extends through a center of the interposed portion and is parallel with the fin height direction.

* * * * *